US012615031B2

(12) United States Patent
   Inoue et al.

(10) Patent No.:  US 12,615,031 B2
(45) Date of Patent:      Apr. 28, 2026

(54) ACOUSTIC WAVE DEVICE AND METHOD OF MANUFACTURING THE SAME

(71) Applicant: Murata Manufacturing Co., Ltd., Nagaokakyo (JP)

(72) Inventors: Kazunori Inoue, Nagaokakyo (JP); Takashi Yamane, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 161 days.

(21) Appl. No.: 18/414,527

(22) Filed: Jan. 17, 2024

(65) Prior Publication Data

US 2024/0154601 A1      May 9, 2024

Related U.S. Application Data

(63) Continuation of application No. PCT/JP2022/025939, filed on Jun. 29, 2022.

(60) Provisional application No. 63/223,639, filed on Jul. 20, 2021.

(51) Int. Cl.
   *H03H 9/17*      (2006.01)
   *H03H 3/02*      (2006.01)
   *H03H 9/02*      (2006.01)

(52) U.S. Cl.
   CPC ............. *H03H 9/174* (2013.01); *H03H 3/02* (2013.01); *H03H 9/02015* (2013.01); *H03H 9/02228* (2013.01); *H03H 2003/023* (2013.01)

(58) Field of Classification Search
   CPC .... H03H 9/174; H03H 9/02228; H03H 9/173; H03H 3/02; H03H 9/02015; H03H 2003/021; H03H 2003/023
   See application file for complete search history.

(56) References Cited

U.S. PATENT DOCUMENTS 9,013,088 B1      4/2015  Sparks et al.
10,491,192 B1 *  11/2019  Plesski .............. H03H 9/02228
      (Continued)

FOREIGN PATENT DOCUMENTS

CN      112787614 A      5/2021
JP      2012257019 A    12/2012
      (Continued)

OTHER PUBLICATIONS

International Search Report in PCT/JP2022/025939, mailed Sep. 13, 2022, 3 pages.
      (Continued)

*Primary Examiner* — Quan Tra
(74) *Attorney, Agent, or Firm* — Keating & Bennett, LLP

(57)      ABSTRACT

An acoustic wave device includes a support including a support substrate, a piezoelectric layer on the support, and a functional electrode on the piezoelectric layer and including at least one pair of electrodes. The support includes a cavity portion overlapping at least a portion of the functional electrode in plan view. The piezoelectric layer includes a membrane portion overlapping the cavity portion in plan view, and a supported portion supported by the support. A boundary covering electrode is provided on the piezoelectric layer over an entire or substantially an entire portion overlapping a boundary between the membrane portion and the supported portion in plan view.

24 Claims, 17 Drawing Sheets

(56) References Cited

U.S. PATENT DOCUMENTS

| | | | | |
|---|---|---|---|---|
| 2013/0234805 A1* | 9/2013 | Takahashi | .............. | H10N 30/87 |
| | | | | 29/25.35 |
| 2014/0009032 A1* | 1/2014 | Takahashi | .......... | H03H 9/02559 |
| | | | | 29/25.35 |
| 2017/0250671 A1* | 8/2017 | Omura | ............... | H03H 9/02228 |
| 2019/0068155 A1* | 2/2019 | Kimura | ................... | H03H 3/02 |
| 2019/0386633 A1 | 12/2019 | Plesski | | |
| 2022/0216844 A1 | 7/2022 | Yamane et al. | | |

FOREIGN PATENT DOCUMENTS

| | | |
|---|---|---|
| JP | 2013214954 A | 10/2013 |
| JP | 2014013991 A | 1/2014 |
| WO | 2021060513 A1 | 4/2021 |

OTHER PUBLICATIONS

Written Opinion in PCT/JP2022/025939, mailed Sep. 13, 2022, 3 pages.

* cited by examiner

FIG. 8A
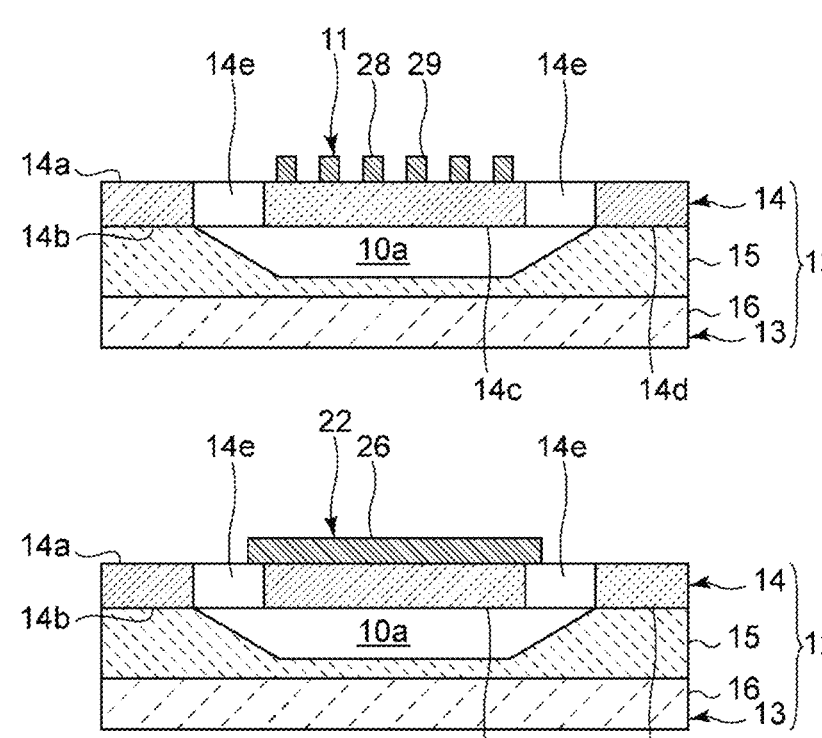
FIG. 8B
FIG. 9
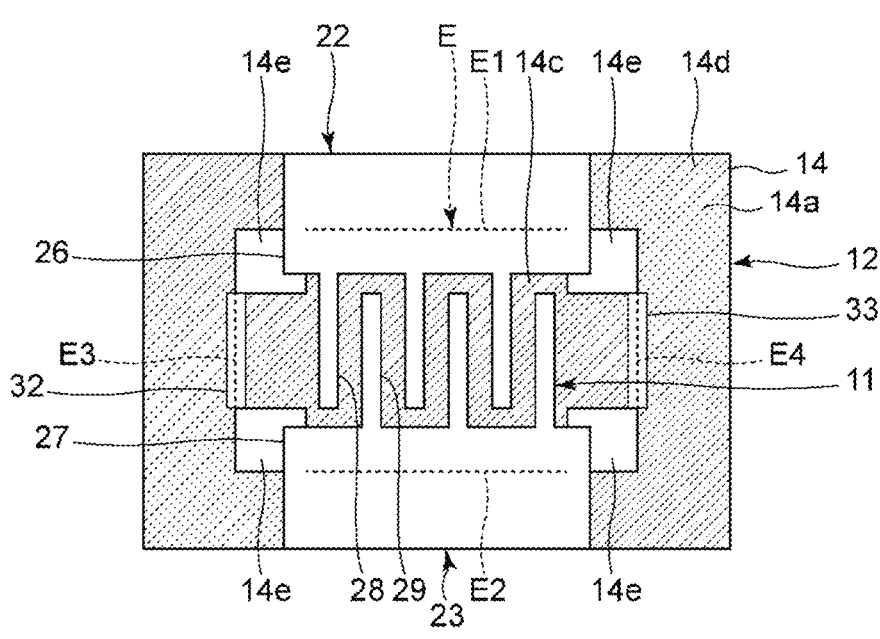

ACOUSTIC WAVE DEVICE AND METHOD OF MANUFACTURING THE SAME

CROSS REFERENCE TO RELATED APPLICATIONS

This application claims the benefit of priority to Provisional Application No. 63/223,639 filed on Jul. 20, 2021 and is a Continuation Application of PCT Application No. PCT/JP2022/025939 filed on Jun. 29, 2022. The entire contents of each application are hereby incorporated herein by reference.

BACKGROUND OF THE INVENTION

1. Field of the Invention

The present invention relates to acoustic wave devices and methods of manufacturing the same.

2. Description of the Related Art

In the past, acoustic wave devices have been widely used as filters for cellular phones or the like. In recent years, an acoustic wave device in which a bulk wave in a thickness-shear mode is used has been proposed as described in U.S. Pat. No. 10,491,192. In this acoustic wave device, a piezoelectric layer is provided on a support body. A pair of electrodes are provided on the piezoelectric layer. The pair of electrodes face each other on the piezoelectric layer, and are connected to different electric potentials. By applying an AC voltage to a gap between the above electrodes, a bulk wave in a thickness-shear mode is excited.

In a piezoelectric bulk wave device described in U.S. Pat. No. 10,491,192, a through-hole is provided in the support body. The piezoelectric layer is provided on the support body so as to cover the through-hole. Thus, the piezoelectric layer includes a portion supported by the support body, and a portion not supported by the support body. Then, stress is likely to concentrate on a boundary in the piezoelectric layer between the portion supported by the support body and the portion not supported by the support body. Thus, a crack may occur in the piezoelectric layer with the boundary as a starting point.

SUMMARY OF THE INVENTION

Example embodiments of the present invention provide acoustic wave devices in each of which of which a crack is unlikely to occur in a piezoelectric layer, and methods of manufacturing such acoustic wave devices.

An acoustic wave device according to an example embodiment of the present invention includes a support including a support substrate, a piezoelectric layer on the support, and a functional electrode on the piezoelectric layer and including at least one pair of electrodes, wherein the support includes a cavity portion overlapping at least a portion of the functional electrode in plan view, the piezoelectric layer includes a membrane portion overlapping the cavity portion in plan view, and a supported portion supported by the support, and a boundary covering electrode is provided on the piezoelectric layer over an entire or substantially an entire portion overlapping a boundary between the membrane portion and the supported portion in plan view.

A method of manufacturing the acoustic wave device according to the above-described example embodiment of the present invention includes laminating the piezoelectric layer and the support, providing the functional electrode and the boundary covering electrode on the piezoelectric layer, and forming the cavity portion in the support so as to open toward the piezoelectric layer to form the membrane portion and the supported portion of the piezoelectric layer, wherein in the forming the cavity portion, the cavity portion is formed such that the cavity portion overlaps at least a portion of the functional electrode in plan view, and the boundary covering electrode is located over an entire or substantially an entire portion overlapping a boundary between the membrane portion and the supported portion in plan view.

According to example embodiments of the present invention, acoustic wave devices in each of which a crack is unlikely to occur in a piezoelectric layer, and methods of manufacturing such acoustic wave devices are able to be provided.

The above and other elements, features, steps, characteristics and advantages of the present invention will become more apparent from the following detailed description of the example embodiments with reference to the attached drawings.

BRIEF DESCRIPTION OF THE DRAWINGS

FIG. 8A is a schematic cross-sectional view illustrating the portion corresponding to the cross-section taken along the line I-I in FIG. 1, for explaining a sacrificial layer removing step in an example of a method of manufacturing the acoustic wave device according to the first example embodiment of the present invention. FIG. 8B is a schematic cross-sectional view illustrating the portion corresponding to the cross-section taken along the line II-II in FIG. 1, for explaining the sacrificial layer removing step in the example of the method of manufacturing the acoustic wave device according to the first example embodiment of the present invention.

FIG. 9 is a schematic plan view of an acoustic wave device according to a second example embodiment of the present invention.

DETAILED DESCRIPTION OF THE EXAMPLE EMBODIMENTS

The present invention will be clarified below by describing example embodiments of the present invention with reference to the drawings.

The example embodiments described in the present specification are merely examples, and partial replacement or combination of configurations is possible between different example embodiments.

Figure 1:
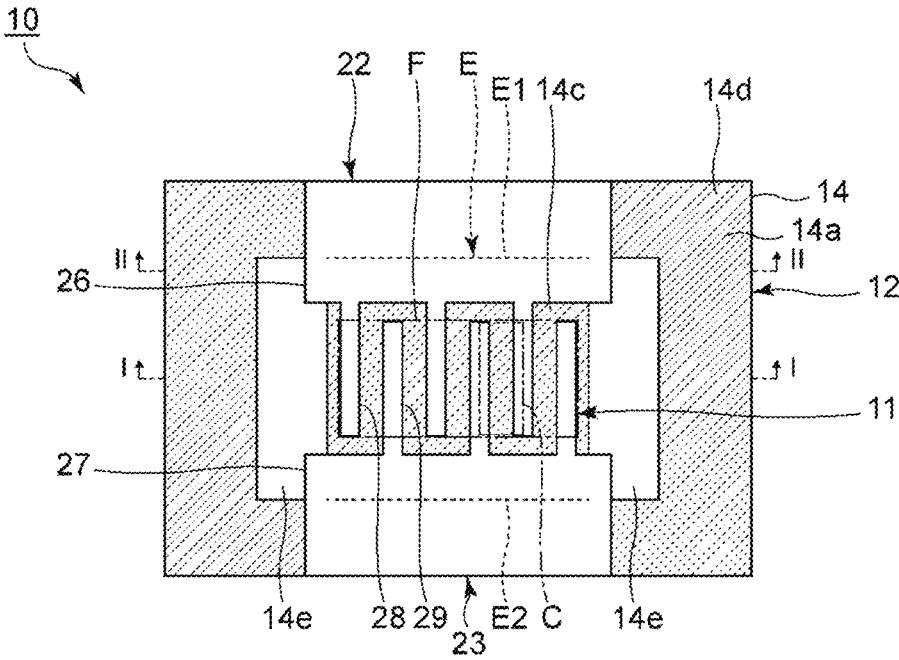
FIG. 1 is a schematic plan view of an acoustic wave device according to a first example embodiment of the present invention.
Figure 2:
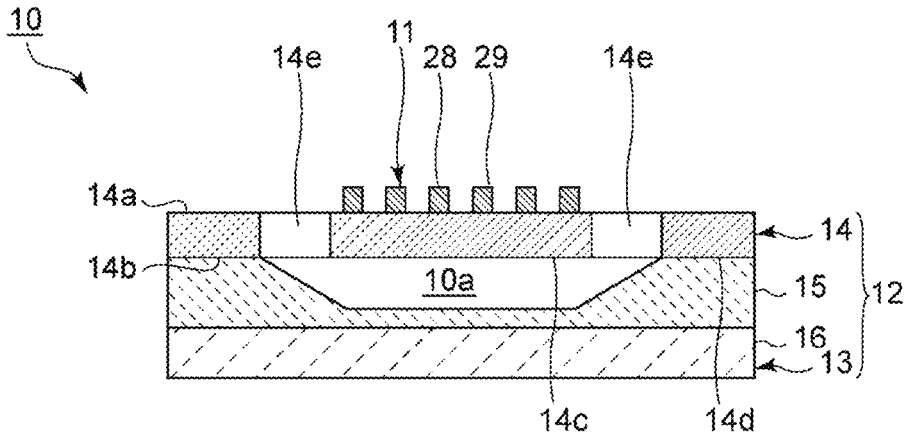
FIG. 2 is a schematic cross-sectional view taken along a line I-I in FIG. 1.

FIG. 1 is a schematic plan view of an acoustic wave device according to a first example embodiment of the present invention. FIG. 2 is a schematic cross-sectional view taken along the line I-I in FIG. 1. Note that in FIG. 1, a piezoelectric layer described later is hatched and illustrated. The same applies to schematic plan views other than FIG. 1.

As illustrated in FIG. 1, an acoustic wave device 10 includes a piezoelectric substrate 12 and an IDT electrode 11. As illustrated in FIG. 2, the piezoelectric substrate 12 includes a support 13 and a piezoelectric layer 14. In the present example embodiment, the support 13 includes a support substrate 16 and an insulating layer 15. The insulating layer 15 is provided on the support substrate 16. The piezoelectric layer 14 is provided on the insulating layer 15. However, the support 13 may include only the support substrate 16.

The piezoelectric layer 14 includes a first main surface 14a and a second main surface 14b. The first main surface 14a and the second main surface 14b face each other. Of the first main surface 14a and the second main surface 14b, the second main surface 14b is located closer to the support 13.

As a material of the support substrate 16, for example, a semiconductor such as silicon, ceramics such as aluminum oxide, or the like can be used. As a material of the insulating layer 15, for example, an appropriate dielectric such as silicon oxide or tantalum oxide can be used. In the present example embodiment, the piezoelectric layer 14 is, for example, a lithium tantalate layer such as a LiTaO$_3$ layer, or a lithium niobate layer such as a LiNbO$_3$ layer.

As illustrated in FIG. 2, the support 13 includes a cavity portion 10a. More specifically, a concave portion is provided in the insulating layer 15. The piezoelectric layer 14 is provided on the insulating layer 15 so as to close the concave portion. Thus, the cavity portion 10a is provided. As described above, in the present example embodiment, the cavity portion 10a is provided only in the insulating layer 15. However, the cavity portion 10a may be provided in the insulating layer 15 and the support substrate 16, or may be provided only in the support substrate 16. The cavity portion 10a may be a through-hole provided in the support 13.

The piezoelectric layer 14 includes a membrane portion 14c and a supported portion 14d. The membrane portion 14c is a portion of the piezoelectric layer 14 that overlaps the cavity portion 10a in plan view. In the present specification, "in plan view" refers to viewing from a direction corresponding to an upper side in FIG. 2. In FIG. 2, for example, of the support substrate 16 and the piezoelectric layer 14, the piezoelectric layer 14 is on the upper side. On the other hand, the supported portion 14d is a portion of the piezoelectric layer 14 that is supported by the support 13.

A plurality of through-holes 14e are provided in the piezoelectric layer 14 so as to extend to the cavity portion 10a. The plurality of through-holes 14e are provided to remove a sacrificial layer when the cavity portion 10a is formed. In the present example embodiment, the two through-holes 14e are provided. The number and positions of the through-holes 14e are not particularly limited. Alternatively, only the through-hole 14e may be provided. When the through-hole 14e is not provided in the piezoelectric layer 14, the cavity portion 10a may be a through-hole provided in the support 13 by backside etching or the like, for example.

The IDT electrode 11 defines and functions as a functional electrode on the first main surface 14a of the piezoelectric layer 14. In plan view, at least a portion of the IDT electrode 11 overlaps the cavity portion 10a of the support 13.

As illustrated in FIG. 1, the IDT electrode 11 includes one pair of busbars and a plurality of pairs of electrodes. The one pair of busbars are specifically a first busbar 26 and a second busbar 27. The first busbar 26 and the second busbar 27 face each other. The plurality of pairs of electrodes are specifically a plurality of first electrode fingers 28 and a plurality of second electrode fingers 29. One end of each of the plurality of first electrode fingers 28 is connected to the first busbar 26. One end of each of the plurality of second electrode fingers 29 is connected to the second busbar 27. The plurality of first electrode fingers 28 and the plurality of second electrode fingers 29 are interdigitated with each other. One pair of electrodes in the present specification correspond to one pair of the first electrode finger 28 and the second electrode finger 29 adjacent to each other. The first electrode finger 28 and the second electrode finger 29 are connected to different electric potentials. The IDT electrode 11 may include a single-layer metal film or may include a laminated metal film.

Hereinafter, the first electrode finger 28 and the second electrode finger 29 may each be simply referred to as an electrode finger. When a direction in which a plurality of electrode fingers extends is defined as an electrode finger extending direction, and a direction in which adjacent electrode fingers face each other is defined as an electrode finger facing direction, the electrode finger extending direction and the electrode finger facing direction are orthogonal or substantially orthogonal to each other in the present example embodiment.

By applying an AC voltage to the IDT electrode 11, an acoustic wave is excited. The acoustic wave device 10 is an acoustic wave resonator structured such that a bulk wave in a thickness-shear mode, such as a thickness-shear first order mode, for example, is usable. The acoustic wave device 10 may be structured such that a plate wave is usable.

The cavity portion 10a of the support 13 illustrated in FIG. 2 is an acoustic reflecting portion in the present specification. The acoustic reflecting portion can effectively confine energy of an acoustic wave to a side of the piezoelectric layer 14. However, an acoustic multilayer film described later may be provided as the acoustic reflecting portion.

A broken line in FIG. 1 indicates a boundary E between the membrane portion 14c and the supported portion 14d in the piezoelectric layer 14. In the present example embodiment, a portion of each through-hole 14e of the piezoelectric layer 14 is located at an outer peripheral edge of the membrane portion 14c. The portion of the through-hole 14e located at the outer peripheral edge of the membrane portion 14c is not supposed to be included in the boundary E. Thus, in the acoustic wave device 10, the boundary E between the membrane portion 14c and the supported portion 14d is divided by the through-holes 14e.

To be more specific, a shape of the outer peripheral edge of the membrane portion 14c in plan view is a rectangle or substantially a rectangle. The outer peripheral edge of the membrane portion 14c includes two sides extending in a direction parallel or substantially parallel to the electrode finger extending direction, and two sides extending in a direction parallel or substantially parallel to the electrode finger facing direction. Of the two through-holes 14e, the through-hole 14e on one side is provided so as to include an entirety or substantially an entirety of one of the two sides extending in the direction parallel or substantially parallel to the electrode finger extending direction in the outer peripheral edge of the membrane portion 14c. Similarly, the through-hole 14e on another side is provided so as to include an entirety or substantially an entirety of another of the above two sides. Thus, in the present example embodiment, the boundary E between the membrane portion 14c and the supported portion 14d includes only portions corresponding to the two sides extending in the direction parallel or substantially parallel to the electrode finger facing direction in the outer peripheral edge of the membrane portion 14c.

The shape of the outer peripheral edge of the membrane portion 14c in plan view is not limited to a rectangle or substantially a rectangle. For example, the shape of the outer peripheral edge of the membrane portion 14c in plan view may be a polygon other than a rectangle or a shape including a curve.

Hereinafter, an electrode provided on the piezoelectric layer 14 at a portion overlapping the boundary E between the membrane portion 14c and the supported portion 14d in plan view is referred to as a boundary covering electrode. In the present example embodiment, the boundary covering electrode is provided, on the piezoelectric layer 14, over an entire or substantially an entire portion overlapping the boundary E. More specifically, in the present example embodiment, the first busbar 26 and the second busbar 27 are the boundary covering electrodes. Since the acoustic wave device 10 has the above configuration, a crack is unlikely to occur in the piezoelectric layer 14. This will be described below.

The piezoelectric layer 14 is in contact with the support 13 at the supported portion 14d. On the other hand, the membrane portion 14c is not in contact with the support 13. Thus, the boundary E between the membrane portion 14c and the supported portion 14d is a portion that physically connects the membrane portion 14c and the support 13 to each other. In the piezoelectric layer 14, stress is likely to concentrate at the boundary E. On the other hand, in the present example embodiment, the boundary covering electrodes are provided, on the piezoelectric layer 14, over the entire or substantially an entire portion overlapping the boundary E. The boundary covering electrodes can protect all of the boundary E where stress is concentrated in the piezoelectric layer 14. Thus, a crack is unlikely to occur in the piezoelectric layer 14.

The configuration of the present example embodiment will be described in more detail below. As illustrated in FIG. 1, the acoustic wave device 10 includes a first wiring electrode 22 and a second wiring electrode 23. More specifically, the first wiring electrode 22 includes the first busbar 26. The first busbar 26 is a portion of the first wiring electrode 22 that electrically connects the first electrode fingers 28 to each other. The first wiring electrode 22 and the IDT electrode 11 share the first busbar 26. The first wiring electrode 22 electrically connects the acoustic wave device 10 to another element or to an outside.

On the other hand, the second wiring electrode 23 includes the second busbar 27. The second busbar 27 is a portion of the second wiring electrode 23 that electrically connects the second electrode fingers 29 to each other. The second wiring electrode 23 and the IDT electrode 11 share the second busbar 27. The second wiring electrode 23 electrically connects the acoustic wave device 10 to another element or to the outside, similar to the first wiring electrode 22.

As described above, in the present example embodiment, the boundary covering electrodes are the first busbar 26 and the second busbar 27. More specifically, the boundary covering electrodes are the first busbar 26 in the first wiring electrode 22, and the second busbar 27 in the second wiring electrode 23.

Figure 3:
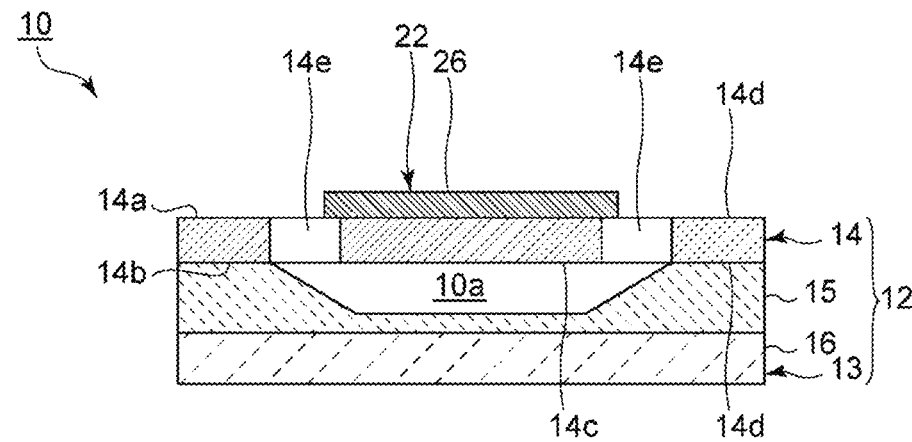
FIG. 3 is a schematic cross-sectional view taken along a line II-II in FIG. 1.

FIG. 3 is a schematic cross-sectional view taken along the line II-II in FIG. 1.

The first wiring electrode 22 covers a portion of each through-hole 14e. Similarly, the second wiring electrode 23 illustrated in FIG. 1 also covers a portion of each through-hole 14e. However, the positional relationship among the first wiring electrode 22 and the second wiring electrode 23, and the through-hole 14e is not limited to the above. The first wiring electrode 22 and the second wiring electrode 23 may not cover a portion of the through-hole 14e.

As illustrated in FIG. 2, a portion of an outer peripheral edge of the through-hole 14e provided in the piezoelectric layer 14 overlaps a portion of an outer peripheral edge of the cavity portion 10a in plan view. However, for example, the through-hole 14e may extend to both the cavity portion 10a and the support 13. In this case as well, as in the present example embodiment, the through-hole 14e includes a portion located at the outer peripheral edge of the membrane portion 14c. Then, in this portion, the piezoelectric layer 14 does not include the boundary between the membrane portion 14c and the supported portion 14d.

As illustrated in FIG. 1, when viewed from the electrode finger facing direction, a region where adjacent electrode fingers overlap each other is an intersection region F. The intersection region F is a region including an electrode finger at one end to an electrode finger at another end in the electrode finger facing direction of the IDT electrode 11. More specifically, the intersection region F includes a region from an outer edge portion of the above electrode finger at the one end in the electrode finger facing direction to an outer edge portion of the above electrode finger at the other end in the electrode finger facing direction.

Further, the acoustic wave device 10 includes a plurality of excitation regions C. A bulk wave in a thickness-shear mode is excited in the plurality of excitation regions C. The excitation region C is, similar to the intersection region F, a region where adjacent electrode fingers overlap each other when viewed from the electrode finger facing direction. Each excitation region C is a region between one pair of electrode fingers. More specifically, the excitation region C is a region from a center in the electrode finger facing direction of one electrode finger to a center in the electrode finger facing direction of another electrode finger. Thus, the intersection region F includes the plurality of excitation regions C. When the acoustic wave device 10 is configured such that a bulk wave in a thickness-shear mode is usable as in the present example embodiment, the piezoelectric layer 14 is preferably, for example, a lithium niobate layer or a lithium tantalate layer.

On the other hand, when the acoustic wave device 10 is configured such that a plate wave is usable, the intersection region F is an excitation region. In this case, as a material of the piezoelectric layer 14, for example, lithium niobate, lithium tantalate, zinc oxide, aluminum nitride, crystal, lead zirconate titanate (PZT), or the like may be used.

An example of a method of manufacturing the acoustic wave device 10 of the present example embodiment will be described below.

Figure 4A:
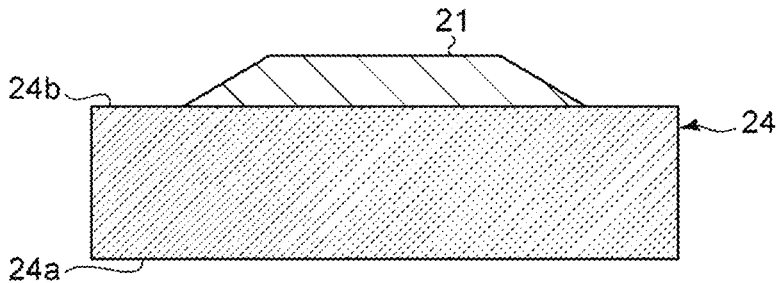
FIGS. 4A to 4C are schematic cross-sectional views illustrating a portion corresponding to the cross-section taken along the line I-I in FIG. 1, for explaining a sacrificial layer forming step, an insulating layer forming step and an insulating layer flattening step, in an example of a method of manufacturing the acoustic wave device according to the first example embodiment of the present invention.
Figure 4B:
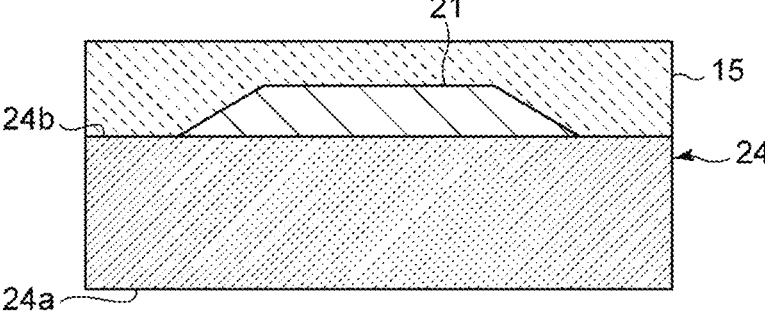
Figure 4C:
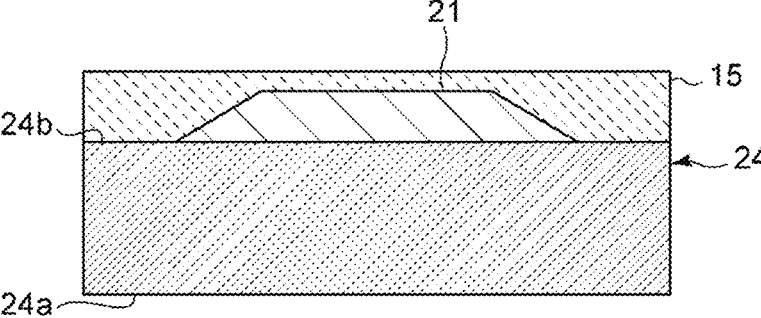
Figure 5A:
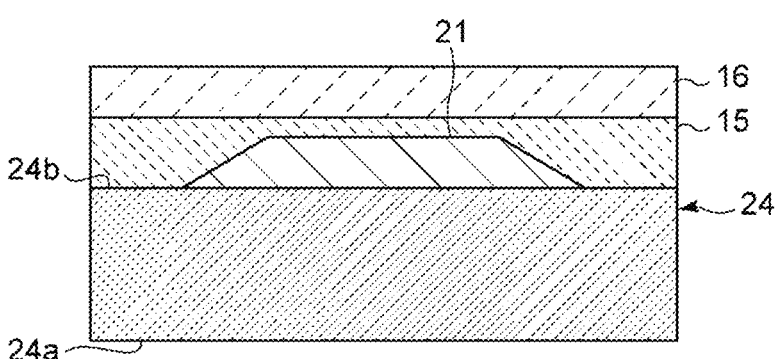
FIGS. 5A to 5C are schematic cross-sectional views illustrating the portion corresponding to the cross-section taken along the line I-I in FIG. 1, for explaining a piezoelectric substrate bonding step, a piezoelectric layer grinding step and an electrode forming step in an example of a method of manufacturing the acoustic wave device according to the first example embodiment of the present invention.
Figure 5B:
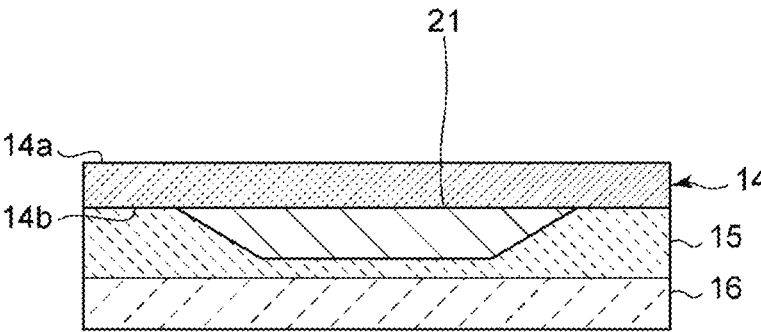
Figure 5C:
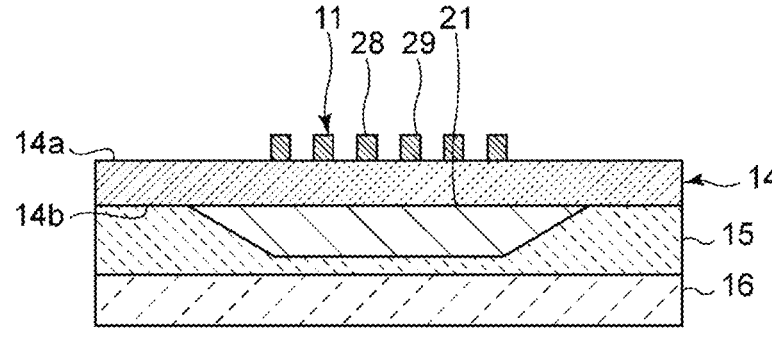
Figure 6:
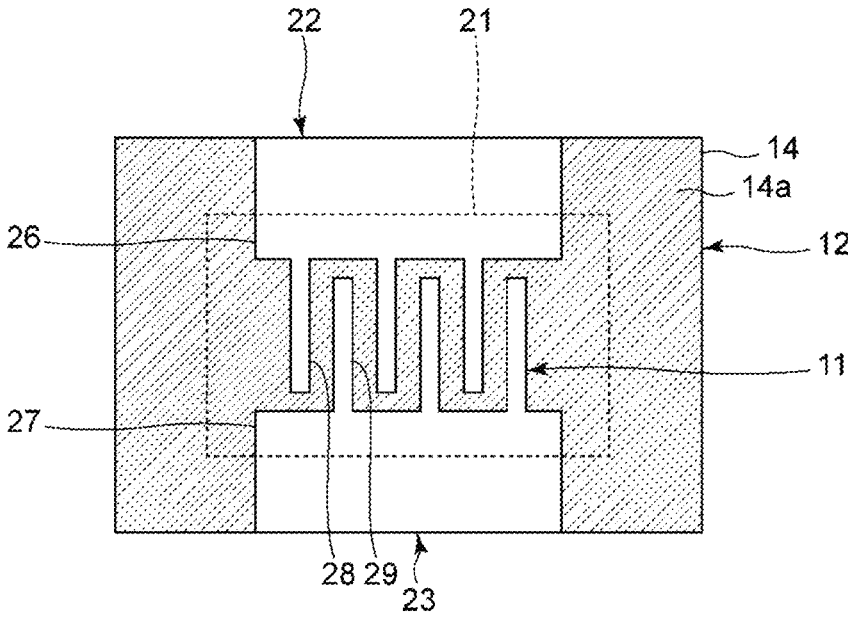
FIG. 6 is a schematic plan view for explaining the electrode forming step in an example of a method of manufacturing the acoustic wave device according to the first example embodiment of the present invention.

FIGS. 4A to 4C are schematic cross-sectional views illustrating a portion corresponding to the cross-section taken along the line I-I in FIG. 1, for explaining a sacrificial layer forming step, an insulating layer forming step and an insulating layer flattening step, in an example of a method of manufacturing the acoustic wave device according to the first example embodiment. FIGS. 5A to 5C are schematic cross-sectional views illustrating the portion corresponding to the cross-section taken along the line I-I in FIG. 1, for explaining a piezoelectric substrate bonding step, a piezoelectric layer grinding step and an electrode forming step in the example of the method of manufacturing the acoustic wave device according to the first example embodiment. FIG. 6 is a schematic plan view for explaining the electrode forming step in the example of the method of manufacturing the acoustic wave device according to the first example embodiment.

Figure 7A:
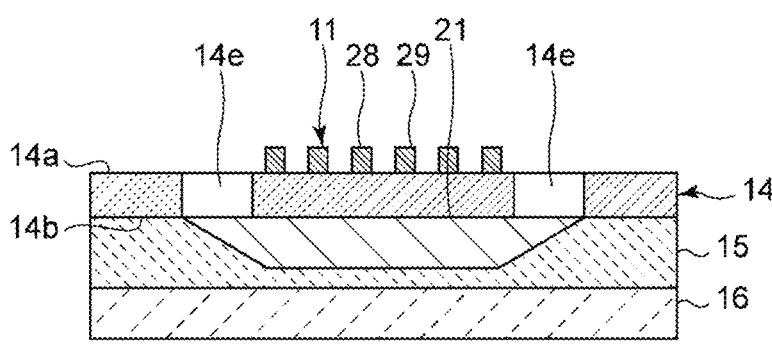
FIG. 7A is a schematic cross-sectional view illustrating the portion corresponding to the cross-section taken along the line I-I in FIG. 1, for explaining a through-hole forming step in an example of a method of manufacturing the acoustic wave device according to the first example embodiment of the present invention.
Figure 7B:
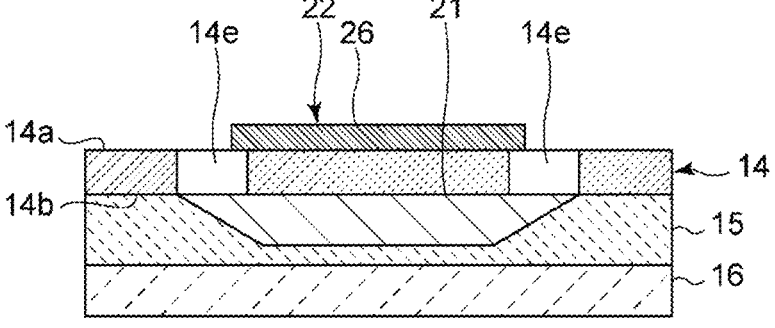
FIG. 7B is a schematic cross-sectional view illustrating a portion corresponding to the cross-section taken along the line II-II in FIG. 1, for explaining the through-hole forming step in an example of a method of manufacturing the acoustic wave device according to the first example embodiment of the present invention.

FIG. 7A is a schematic cross-sectional view illustrating the portion corresponding to the cross-section taken along the line I-I in FIG. 1, for explaining a through-hole forming step in the example of the method of manufacturing the acoustic wave device according to the first example embodiment. FIG. 7B is a schematic cross-sectional view illustrating a portion corresponding to the cross-section taken along the line II-II in FIG. 1, for explaining the through-hole forming step in the example of the method of manufacturing the acoustic wave device according to the first example embodiment. FIG. 8A is a schematic cross-sectional view illustrating the portion corresponding to the cross-section taken along the line I-I in FIG. 1, for explaining a sacrificial layer removing step in the example of the method of manufacturing the acoustic wave device according to the first example embodiment. FIG. 8B is a schematic cross-sectional view illustrating the portion corresponding to the cross-section taken along the line II-II in FIG. 1, for explaining the sacrificial layer removing step in the example of the method of manufacturing the acoustic wave device according to the first example embodiment.

As illustrated in FIG. 4A, a piezoelectric substrate 24 is prepared. The piezoelectric substrate 24 is included in the piezoelectric layer. The piezoelectric substrate 24 includes a first main surface 24a and a second main surface 24b. The first main surface 24a and the second main surface 24b face each other. A sacrificial layer 21 is formed on the second main surface 24b. Next, the sacrificial layer 21 is patterned by, for example, performing etching. As a material of the sacrificial layer 21, for example, ZnO, SiO$_2$, Cu, resin, or the like can be used.

Next, as illustrated in FIG. 4B, the insulating layer 15 is formed on the second main surface 24b of the piezoelectric substrate 24 so as to cover the sacrificial layer 21. The insulating layer 15 can be formed by, for example, a sputtering method, a vacuum deposition method, or the like. Next, as illustrated in FIG. 4C, the insulating layer 15 is flattened. For example, when the insulating layer 15 is flattened, it is sufficient to use grinding or a chemical mechanical polishing (CMP) method.

Next, as illustrated in FIG. 5A, the support substrate 16 is laminated on a main surface of the insulating layer 15 on a side opposite to the piezoelectric substrate 24. Thus, the insulating layer 15 and the support substrate 16 are bonded to each other to form a support. Thus, the piezoelectric substrate 24 as the support and the piezoelectric layer are laminated. However, the cavity portion 10a illustrated in FIG. 2 is formed in a later step. Next, a thickness of the piezoelectric substrate 24 illustrated in FIG. 5A is adjusted. More specifically, the thickness of the piezoelectric substrate 24 is reduced by, for example, grinding or polishing a side of the main surface of the piezoelectric substrate 24 that is not bonded to the support substrate 16. For adjusting the thickness of the piezoelectric substrate 24, for example, grinding, a CMP method, an ion slicing method, etching, or the like can be used. Thus, as illustrated in FIG. 5B, the piezoelectric layer 14 is obtained.

Next, as illustrated in FIG. 5C and FIG. 6, the IDT electrode 11 is provided on the first main surface 14a of the piezoelectric layer 14. At this time, as illustrated in FIG. 6, the IDT electrode 11 is formed such that at least a portion of the IDT electrode 11 and the sacrificial layer 21 overlap each other in plan view. At the same time, the first wiring electrode 22 and the second wiring electrode 23 are also provided on the first main surface 14a.

More specifically, the first wiring electrode 22 and the second wiring electrode 23 are provided so as to overlap an outer peripheral edge of the sacrificial layer 21 in plan view. That is, each of the first wiring electrode 22 and the second wiring electrode 23 is provided so as to overlap at least a portion of a boundary between a portion where the sacrificial layer 21 is provided and a portion where the sacrificial layer 21 is not provided in plan view. The portion of the first wiring electrode 22 that is provided so as to overlap the boundary in plan view is the first busbar 26. The portion of the second wiring electrode 23 that is provided so as to overlap the above boundary in plan view is the second busbar 27. The IDT electrode 11, the first wiring electrode 22 and the second wiring electrode 23 can be provided by, for example, a sputtering method, a vacuum deposition method, or the like.

Next, as illustrated in FIGS. 7A and 7B, a plurality of the through-holes 14e are provided in the piezoelectric layer 14 so as to extend to the sacrificial layer 21. In the above step, among the electrodes provided on the first main surface 14a of the piezoelectric layer 14, only the first wiring electrode 22 and the second wiring electrode 23 overlap the outer peripheral edge of the sacrificial layer 21 in plan view. The plurality of through-holes 14e are provided so as to extend to portions of the outer peripheral edge of the sacrificial layer 21 that do not overlap the first wiring electrode 22 and the second wiring electrode 23 in plan view. The plurality of through-holes 14e can be formed by, for example, a reactive ion etching (RIE) method or the like.

As illustrated in FIG. 7B, when the through-hole 14e is provided, a portion of the piezoelectric layer 14 that is provided with the first wiring electrode 22 may be removed. In this case, the first wiring electrode 22 is configured to cover a portion of the through-hole 14e. Similarly, the second wiring electrode 23 is configured to cover a portion of the through-hole 14e. However, the through-hole 14e may be formed so as not to be covered with the first wiring electrode 22 and the second wiring electrode 23.

Next, the sacrificial layer 21 is removed through the through-hole 14e. To be more specific, the sacrificial layer 21 in the concave portion of the insulating layer 15 is removed by making an etching solution flow in from the through-hole 14e. Thus, as illustrated in FIGS. 8A and 8B, the cavity portion 10a is formed. Thus, the membrane portion 14c and the supported portion 14d of the piezoelectric layer 14 are formed. Through the above steps, the acoustic wave device 10 is obtained.

In the example of the method of manufacturing described above, the steps of forming the cavity portion 10a include at least the sacrificial layer forming step, the through-hole forming step and the sacrificial layer removing step. In the step illustrated in FIG. 4A, the sacrificial layer 21 is provided so as to overlap, in plan view, at least a portion of a portion where the IDT electrode 11 is to be provided in a later step. At this time, the sacrificial layer 21 is provided such that the outer peripheral edge of the sacrificial layer 21 overlaps, in plan view, portions where the first wiring electrode 22 and the second wiring electrode 23 are to be provided in a later step. Thereafter, the through-hole forming step and the sacrificial layer removing step are performed as described above. Thus, the cavity portion 10a is provided so as to overlap at least a portion of the IDT electrode 11 in plan view. Then, the cavity portion 10a is formed such that the first wiring electrode 22 and the second wiring electrode 23 as the boundary covering electrodes are located over the entire or substantially the entire portion overlapping the boundary E between the membrane portion 14c and the supported portion 14d in plan view.

In the first example embodiment illustrated in FIG. 1, the boundary E includes only a first portion E1 and a second portion E2. To be more specific, the first portion E1 and the second portion E2 are portions corresponding to the two sides extending in the direction parallel or substantially parallel to the electrode finger facing direction in the outer peripheral edge of the membrane portion 14c. The first portion E1 is covered with the first busbar 26 included in the first wiring electrode 22. The second portion E2 is covered with the second busbar 27 included in the second wiring electrode 23. However, portions other than the first portion E1 and the second portion E2 may be included.

Figure 10:
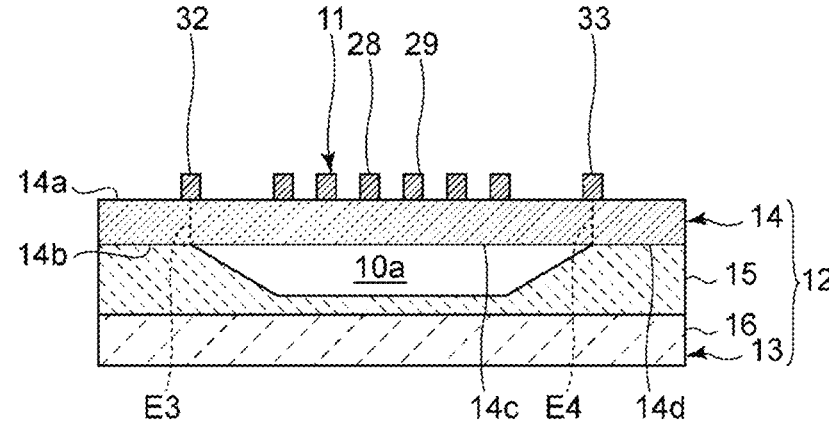
FIG. 10 is a schematic cross-sectional view illustrating a portion corresponding to the cross-section taken along the line I-I in FIG. 1, of the acoustic wave device according to the second example embodiment of the present invention.

FIG. 9 is a schematic plan view of an acoustic wave device according to a second example embodiment of the present invention. FIG. 10 is a schematic cross-sectional view illustrating a portion corresponding to the cross-section taken along the line I-I in FIG. 1, of the acoustic wave device according to the second example embodiment.

As illustrated in FIG. 9 and FIG. 10, the present example embodiment is different from the first example embodiment in that a first floating electrode 32 and a second floating electrode 33 are provided as one pair of floating electrodes. The floating electrode is an electrode that is not electrically connected to any of a signal potential and a ground potential. As illustrated in FIG. 9, the present example embodiment is different from the first example embodiment also in the number and positions of a plurality of the through-holes 14e provided in the piezoelectric layer 14, and in a position of the boundary E between the membrane portion 14c and the supported portion 14d. Except for the above point, the acoustic wave device of the present example embodiment has the same or similar configuration to that of the acoustic wave device 10 of the first example embodiment.

The first floating electrode 32 and the second floating electrode 33 are disposed so as to sandwich the plurality of electrode fingers when viewed from the electrode finger extending direction. The first floating electrode 32 and the second floating electrode 33 extend in the direction parallel or substantially parallel to the electrode finger extending direction. The first floating electrode 32 and the second floating electrode 33 are not connected to the first busbar 26 and the second busbar 27.

The four through-holes 14e are provided in the piezoelectric layer 14. The through-holes 14e include respective corner portions of the outer peripheral edge of the membrane portion 14c in plan view. In the present example embodiment, the boundary E between the membrane portion 14c and the supported portion 14d includes not only the first portion E1 and the second portion E2 but also a third portion E3 and a fourth portion E4. The third portion E3 and the fourth portion E4 are portions corresponding to the two sides extending in the direction parallel or substantially parallel to the electrode finger extending direction in the outer peripheral edge of the membrane portion 14c. The first portion E1, the second portion E2, the third portion E3 and the fourth portion E4 are not connected to one another.

Portions of the boundary E, on the piezoelectric layer 14, that overlap the first portion E1 and the second portion E2 are covered with the first busbar 26 and the second busbar 27, respectively. A portion, on the piezoelectric layer 14, that overlaps the third portion E3 of the boundary E is covered with the first floating electrode 32. Further, a portion, on the piezoelectric layer 14, that overlaps the fourth portion E4 of the boundary E is covered with the second floating electrode 33.

In the present example embodiment, the first busbar 26 included in the first wiring electrode 22, the second busbar 27 included in the second wiring electrode 23, the first floating electrode 32 and the second floating electrode 33 are the boundary covering electrodes. Then, the boundary covering electrodes are provided, on the piezoelectric layer 14, over the entire or substantially the entire portion overlapping the boundary E. Accordingly, the boundary E as a whole is protected by the boundary covering electrodes. Thus, a crack is unlikely to occur in the piezoelectric layer 14.

For example, when the boundary E includes only the first portion E1, the second portion E2 and the third portion E3, it is sufficient that only one floating electrode is provided and the floating electrode is included in the boundary covering electrodes.

Alternatively, for example, the boundary E may include only the first portion E1, the third portion E3 and the fourth portion E4, or may include only the second portion E2, the third portion E3 and the fourth portion E4. In these cases, it is sufficient that the boundary covering electrodes include one of the first wiring electrode 22 and the second wiring electrode 23.

Figure 11:
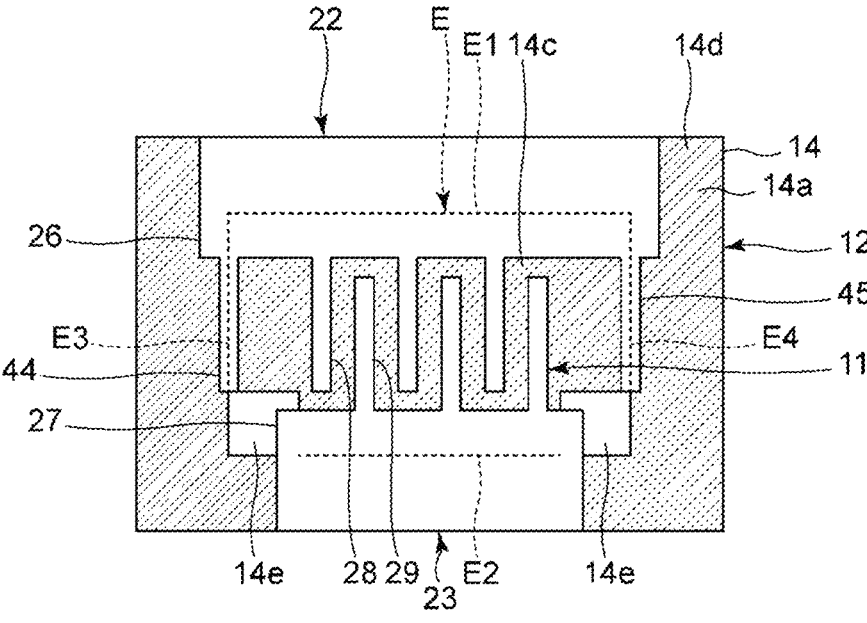
FIG. 11 is a schematic plan view of an acoustic wave device according to a third example embodiment of the present invention.
Figure 12:
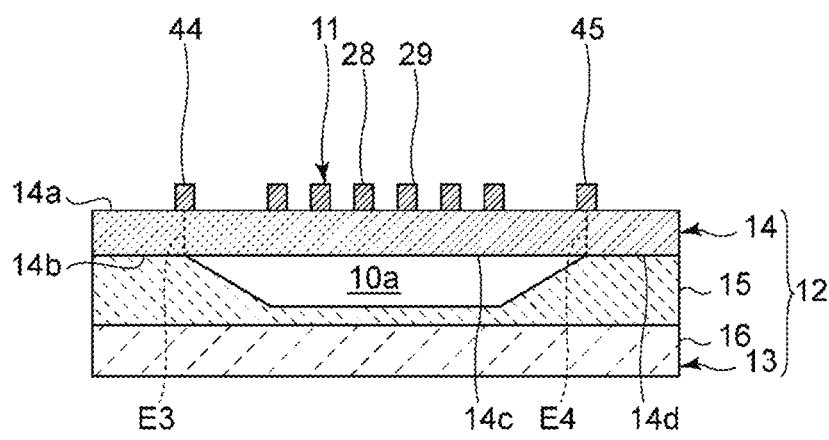
FIG. 12 is a schematic cross-sectional view illustrating a portion corresponding to the cross-section taken along the line I-I in FIG. 1, of the acoustic wave device according to the third example embodiment of the present invention.

FIG. 11 is a schematic plan view of an acoustic wave device according to a third example embodiment of the present invention. FIG. 12 is a schematic cross-sectional view illustrating a portion corresponding to the cross-section taken along the line I-I in FIG. 1, of the acoustic wave device according to the third example embodiment.

As illustrated in FIG. 11 and FIG. 12, the present example embodiment is different from the first example embodiment in that a first extension electrode 44 and a second extension electrode 45 are provided. As illustrated in FIG. 11, the present example embodiment is different from the first example embodiment also in positions of a plurality of the through-holes 14e provided in the piezoelectric layer 14, and a position of the boundary E between the membrane portion 14c and the supported portion 14d. Except for the above point, the acoustic wave device of the present example embodiment has the same or similar configuration to that of the acoustic wave device 10 of the first example embodiment.

One end of the first extension electrode 44 is connected to the first busbar 26. The first extension electrode 44 extends toward the second busbar 27. Similarly, one end of the second extension electrode 45 is connected to the first busbar 26. The second extension electrode 45 extends toward the second busbar 27. The first extension electrode 44 and the second extension electrode 45 are not connected to the second busbar 27. The first extension electrode 44 and the second extension electrode 45 are disposed so as to sandwich the plurality of electrode fingers when viewed from the electrode finger extending direction.

The piezoelectric layer 14 includes the two through-holes 14e. The through-holes 14e include respective corner portion of the membrane portion 14c close to the second busbar 27 in plan view. In the present example embodiment, the boundary E between the membrane portion 14c and the supported portion 14d includes the first portion E1, the second portion E2, the third portion E3 and the fourth portion E4. The third portion E3 and the fourth portion E4 are connected by the first portion E1. On the other hand, the second portion E2 is not connected to the first portion E1, the third portion E3 and the fourth portion E4.

Portions of the boundary E, on the piezoelectric layer 14, that overlap the first portion E1 and the second portion E2 are covered with the first busbar 26 and the second busbar 27, respectively. A portion, on the piezoelectric layer 14, that overlaps the third portion E3 of the boundary E is covered with the first busbar 26 and the first extension electrode 44. Additionally, a portion, on the piezoelectric layer 14, that overlaps the fourth portion E4 of the boundary E is covered with the first busbar 26 and the second extension electrode 45.

In the present example embodiment, the first busbar 26 included in the first wiring electrode 22, the second busbar 27 included in the second wiring electrode 23, the first extension electrode 44, and the second extension electrode 45 are the boundary covering electrodes. Then, the boundary covering electrodes are provided, on the piezoelectric layer 14, over the entire or substantially the entire portion overlapping the boundary E. Accordingly, the boundary E as a whole is protected by the boundary covering electrodes. Thus, a crack is unlikely to occur in the piezoelectric layer 14.

For example, when the boundary E includes only the first portion E1, the second portion E2 and the third portion E3, it is also possible that only the first extension electrode 44 is provided of the first extension electrode 44 and the second extension electrode 45. It is sufficient that the first extension electrode 44 is included in the boundary covering electrodes. On the other hand, for example, when the boundary E includes only the first portion E1, the second portion E2 and the fourth portion E4, it is also possible that only the second extension electrode 45 is provided of the first extension electrode 44 and the second extension electrode 45. It is sufficient that the second extension electrode 45 is included in the boundary covering electrodes.

Figure 13:
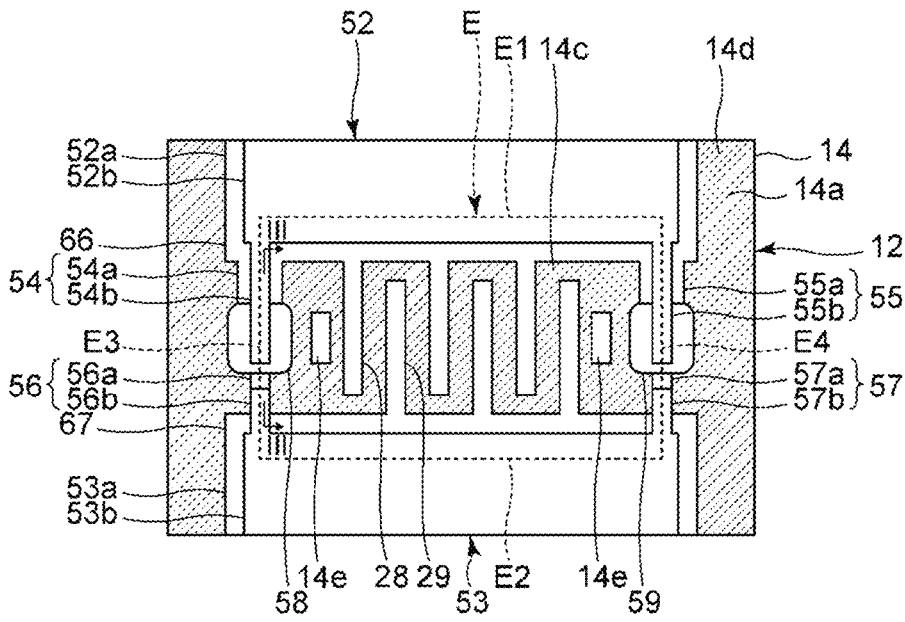
FIG. 13 is a schematic plan view of an acoustic wave device according to a fourth example embodiment of the present invention.
Figure 14:
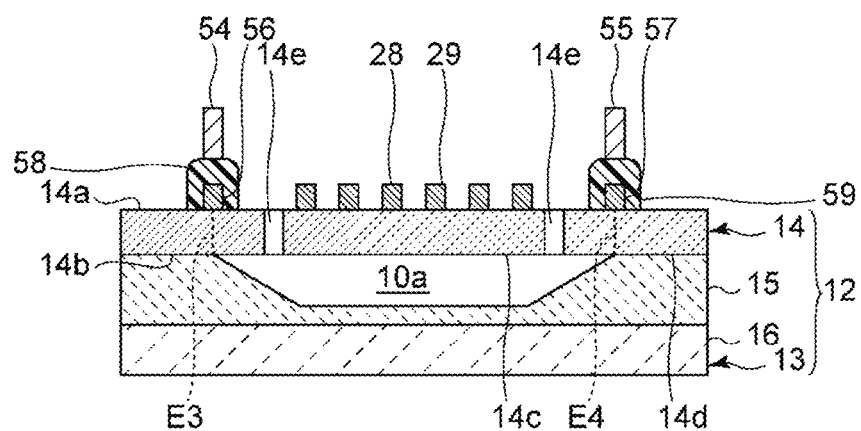
FIG. 14 is a schematic cross-sectional view illustrating a portion corresponding to the cross-section taken along the line I-I in FIG. 1, of the acoustic wave device according to the fourth example embodiment of the present invention.
Figure 15:
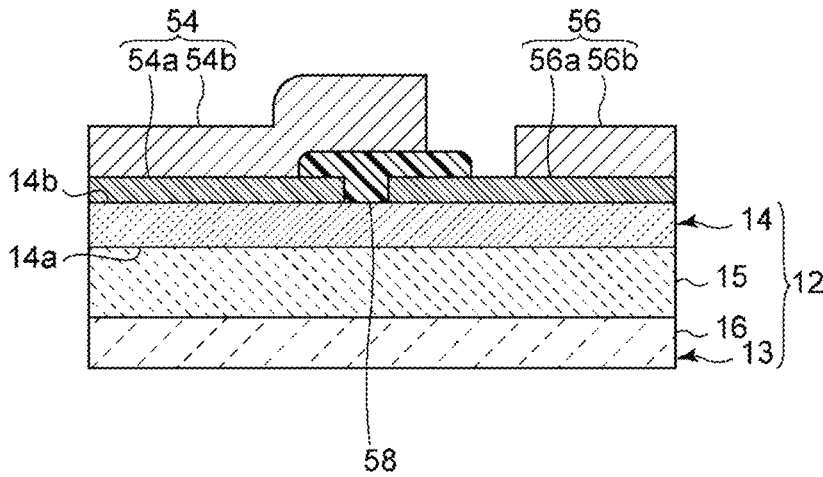
FIG. 15 is a schematic cross-sectional view taken along a line in FIG. 13.

FIG. 13 is a schematic plan view of an acoustic wave device according to a fourth example embodiment. FIG. 14 is a schematic cross-sectional view illustrating a portion corresponding to the cross-section taken along the line I-I in FIG. 1, of the acoustic wave device according to the fourth example embodiment. FIG. 15 is a schematic cross-sectional view taken along the line in FIG. 13.

As illustrated in FIG. 13, the present example embodiment is different from the third example embodiment in that a third extension electrode 56, a fourth extension electrode 57, a first interlayer insulating film 58 and a second interlayer insulating film 59 are provided. The present example embodiment is different from the third example embodiment also in positions of a plurality of the through-holes 14*e* provided in the piezoelectric layer 14, and a position of the boundary E between the membrane portion 14*c* and the supported portion 14*d*. Further, the present example embodiment is different from the third example embodiment in that a first wiring electrode 52, a second wiring electrode 53, a first extension electrode 54 and a second extension electrode 55 are each formed of a laminated metal film. Except for the above point, the acoustic wave device of the present example embodiment has a similar configuration to that of the acoustic wave device of the third example embodiment.

The first wiring electrode 52 has a first layer 52*a* and a second layer 52*b*. To be more specific, the first layer 52*a* and the second layer 52*b* are laminated in this order from a side of the piezoelectric layer 14. Similarly, the second wiring electrode 53 has a first layer 53*a* and a second layer 53*b*. The first extension electrode 54 has a first layer 54*a* and a second layer 54*b*. The second extension electrode 55 has a first layer 55*a* and a second layer 55*b*. In each of the second wiring electrode 53, the first extension electrode 54 and the second extension electrode 55, as in the first wiring electrode 52, the first layer and the second layer are laminated in this order from a side of the piezoelectric layer 14. Note that in each of the first wiring electrode 52, the second wiring electrode 53, the first extension electrode 54 and the second extension electrode 55, the second layer is not laminated on a part of the first layer.

One end of the third extension electrode 56 is connected to a second busbar 67. The third extension electrode 56 extends toward a first busbar 66. Similarly, one end of the fourth extension electrode 57 is connected to the second busbar 67. The fourth extension electrode 57 extends toward the first busbar 66. The third extension electrode 56 and the fourth extension electrode 57 are not electrically connected to the first busbar 66. The third extension electrode 56 and the fourth extension electrode 57 are disposed so as to sandwich the plurality of electrode fingers when viewed from the electrode finger extending direction.

The third extension electrode 56 has a first layer 56*a* and a second layer 56*b*. The fourth extension electrode 57 includes a first layer 57*a* and a second layer 57*b*. In each of the third extension electrode 56 and the fourth extension electrode 57, as in the above first wiring electrode 52, the first layer and the second layer are laminated in this order from a side of the piezoelectric layer 14. Note that in each of the third extension electrode 56 and the fourth extension electrode 57, the second layer is not laminated on a part of the first layer.

As illustrated in FIG. 14, the first extension electrode 54 and the third extension electrode 56 overlap each other in plan view. Specifically, the first interlayer insulating film 58 is provided between the first extension electrode 54 and the third extension electrode 56. Thus, the first extension electrode 54 and the third extension electrode 56 are electrically insulated from each other.

More specifically, as illustrated in FIG. 15, the first layer 54*a* of the first extension electrode 54 and the first layer 56*a* of the third extension electrode 56 face each other with a gap therebetween. The first interlayer insulating film 58 is provided on the first main surface 14*a* of the piezoelectric layer 14 so as to cover a part of the first layer 54*a* of the first extension electrode 54 and a part of the first layer 56*a* of the third extension electrodes 56. The second layer 54*b* of the first extension electrode 54 is provided on the first interlayer insulating film 58. Then, the first interlayer insulating film 58 is located between the second layer 54*b* of the first extension electrode 54 and the first layer 56*a* of the third extension electrode 56. Note that the first interlayer insulating film 58 is also located between a part of the first layer 54*a* of the first extension electrode 54 and a part of the second layer 54*b* of the first extension electrode 54. On the other hand, the second layer 56*b* of the third extension electrode 56 is not in contact with the first interlayer insulating film 58.

As illustrated in FIG. 14, the second extension electrode 55 and the fourth extension electrode 57 overlap each other in plan view. Specifically, the second interlayer insulating film 59 is provided between the second extension electrode 55 and the fourth extension electrode 57. Thus, the second extension electrode 55 and the fourth extension electrode 57 are electrically insulated from each other. A configuration of the second extension electrode 55, the fourth extension electrode 57 and the second interlayer insulating film 59 is similar to the configuration illustrated in FIG. 15.

As illustrated in FIG. 14, in a portion where the first extension electrode 54 and the third extension electrode 56 overlap each other in plan view, it is sufficient that at least a part of the first interlayer insulating film 58 is provided between the first extension electrode 54 and the third extension electrode 56. As illustrated in FIG. 13, the first interlayer insulating film 58 may reach a portion other than the gap between the first extension electrode 54 and the third extension electrode 56. Similarly, in a portion where the second extension electrode 55 and the fourth extension electrode 57 overlap each other in plan view, it is sufficient that at least a part of the second interlayer insulating film 59 is provided between the second extension electrode 55 and the fourth extension electrode 57.

It is sufficient that at least a part of the first extension electrode 54 and at least a part of the third extension electrode 56 overlap each other in plan view. However, an entirety of the first extension electrode 54 in the direction parallel to the electrode finger extending direction and an entirety of the third extension electrode 56 in that direction may overlap each other in plan view. In this case, for example, the first interlayer insulating film 58 may be provided so as to cover the entire third extension electrode 56. Similarly, it is sufficient that at least a part of the second extension electrode 55 and at least a part of the fourth extension electrode 57 overlap each other in plan view.

As materials of the first interlayer insulating film 58 and the second interlayer insulating film 59, an appropriate inorganic insulator, an appropriate resin, or the like can be used.

As illustrated in FIG. 13, the two through-holes 14e are provided in the piezoelectric layer 14. Each through-hole 14e is located inside the outer peripheral edge of the membrane portion 14c in plan view. The boundary E between the membrane portion 14c and the supported portion 14d includes the first portion E1, the second portion E2, the third portion E3 and the fourth portion E4. In the present example embodiment, the first portion E1 and the second portion E2 are connected by the third portion E3 and the fourth portion E4. That is, the boundary E is not divided by the through-hole 14e.

Portions of the boundary E, on the piezoelectric layer 14, that overlap the first portion E1 and the second portion E2 are covered with the first busbar 66 and the second busbar 67, respectively. A portion, on the piezoelectric layer 14, that overlaps the third portion E3 of the boundary E is covered with the first busbar 66, the second busbar 67, the first extension electrode 54 and the third extension electrode 56. Further, a portion, on the piezoelectric layer 14, that overlaps the fourth portion E4 of the boundary E is covered with the first busbar 66, the second busbar 67, the second extension electrode 55 and the fourth extension electrode 57.

In the present example embodiment, the first busbar 66 included in the first wiring electrode 52, the second busbar 67 included in the second wiring electrode 53, the first extension electrode 54, the second extension electrode 55, the third extension electrode 56 and the fourth extension electrode 57 are the boundary covering electrodes. Then, the boundary covering electrodes are provided, on the piezoelectric layer 14, over the entire portion overlapping the boundary E. Accordingly, the boundary E as a whole is protected by the boundary covering electrodes. Thus, a crack is unlikely to occur in the piezoelectric layer 14.

For example, the third extension electrode 56 directly covers a portion overlapping the boundary E on the piezoelectric layer 14. On the other hand, a portion of the first extension electrode 54 indirectly covers a portion overlapping the boundary E on the piezoelectric layer 14 with the first interlayer insulating film 58 interposed therebetween. As described above, it is sufficient that the boundary covering electrodes directly or indirectly cover the portion overlapping the boundary E on the piezoelectric layer 14.

In the present example embodiment, the first wiring electrode 52, the second wiring electrode 53, the first extension electrode 54, the second extension electrode 55, the third extension electrode 56 and the fourth extension electrode 57 are each a laminated metal film. Accordingly, even when the first extension electrode 54, the second extension electrode 55, the third extension electrode 56 and the fourth extension electrode 57 are electrically connected to an IDT electrode, electrical resistance of an acoustic wave resonator can be reduced. However, the first wiring electrode 52, the second wiring electrode 53, the first extension electrode 54, the second extension electrode 55, the third extension electrode 56 and the fourth extension electrode 57 may each be a single-layer metal film.

When at least one electrode of the first extension electrode 54, the second extension electrode 55, the third extension electrode 56 and the fourth extension electrode 57 is provided, the first floating electrode 32 illustrated in FIG. 9 may be provided. Alternatively, in this case, the second floating electrode 33 may be provided. For example, at least a portion of the first floating electrode 32, and at least a portion of the first extension electrode 54 or at least a portion of the third extension electrode 56 may overlap one another in plan view. The first interlayer insulating film 58 may be provided between the first floating electrode 32 and the first extension electrode 54 or the third extension electrode 56.

Similarly, at least a portion of the second floating electrode 33 and at least a portion of the second extension electrode 55 or at least a portion of the fourth extension electrode 57 may overlap one another in plan view. The second interlayer insulating film 59 may be provided between the second floating electrode 33, and the second extension electrode 55 or the fourth extension electrode 58.

An example of a method of manufacturing the acoustic wave device according to the fourth example embodiment will be described below.

Figure 16:
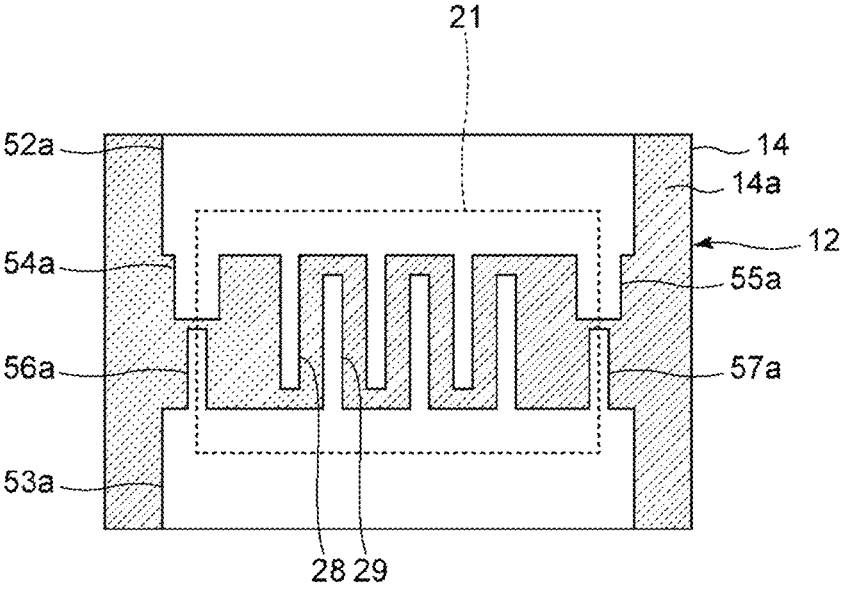
FIG. 16 is a schematic plan view for explaining a step of forming a first layer of each electrode in an example of a method of manufacturing the acoustic wave device according to the fourth example embodiment of the present invention.
Figure 17A:
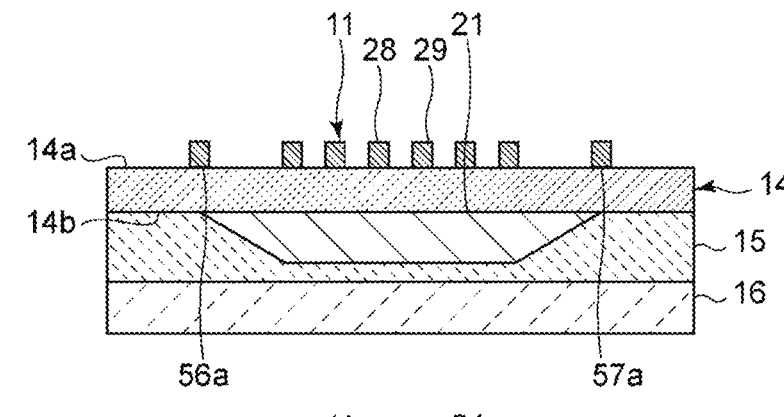
FIGS. 17A and 17B are schematic cross-sectional views illustrating the portion corresponding to the cross-section taken along the line I-I in FIG. 1, for explaining a step of forming a first layer of each electrode and an interlayer insulating film forming step in an example of a method of manufacturing the acoustic wave device according to the fourth example embodiment of the present invention.
Figure 17B:
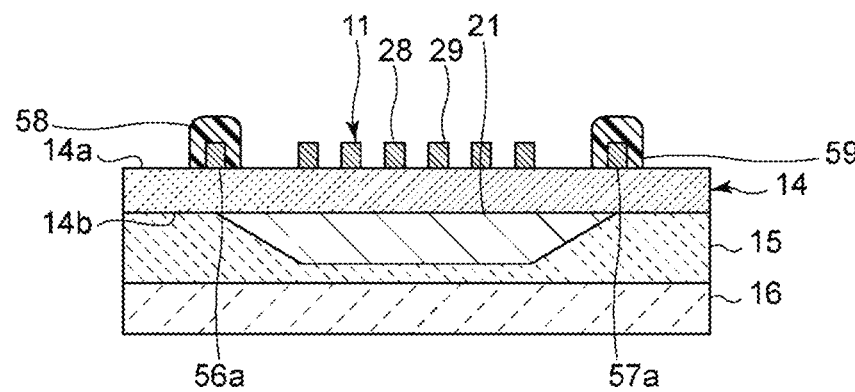
Figure 18:
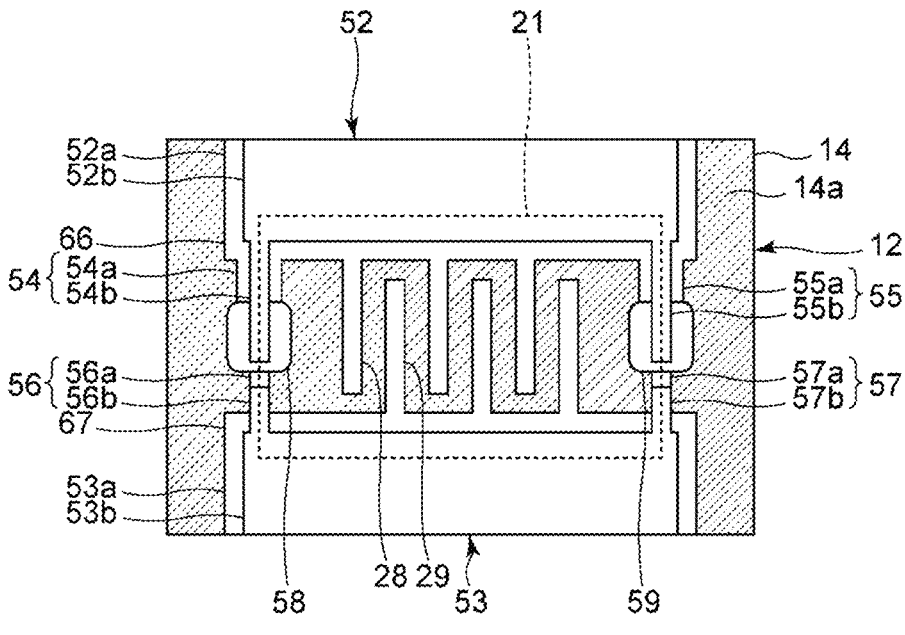
FIG. 18 is a schematic plan view for explaining a step of forming a second layer of each electrode in an example of a method of manufacturing the acoustic wave device according to the fourth example embodiment of the present invention.
Figures 19A, 19B:
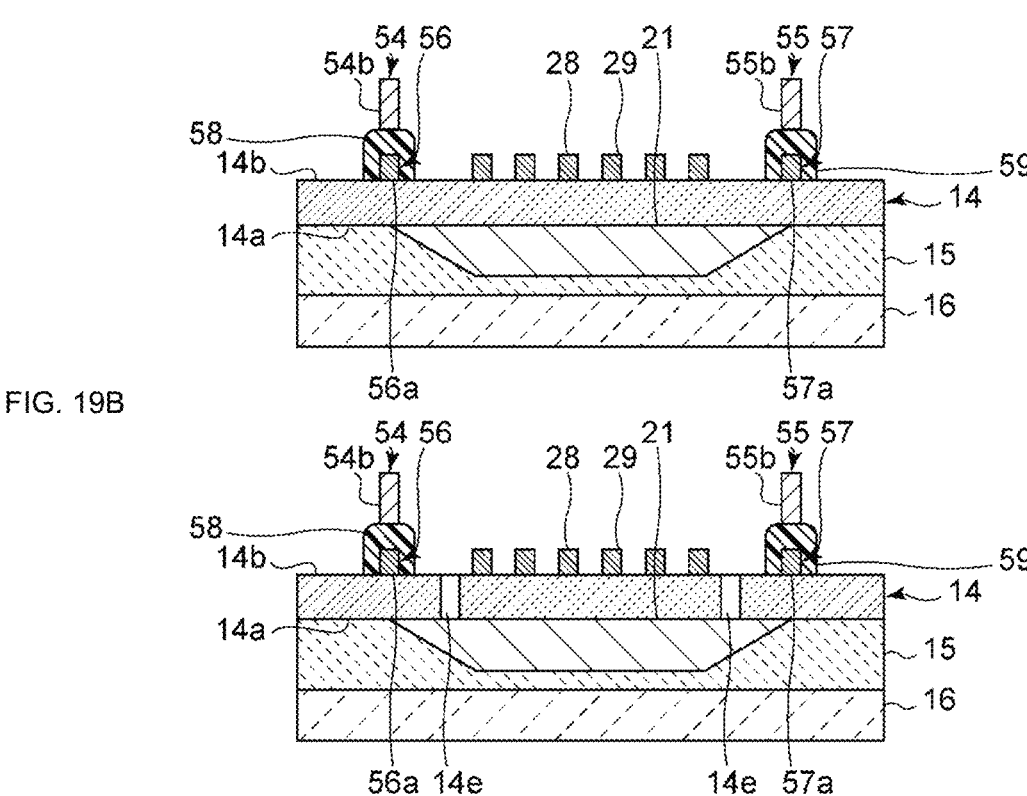
FIGS. 19A and 19B are schematic cross-sectional views illustrating the portion corresponding to the cross-section taken along the line I-I in FIG. 1, for explaining a step of forming the second layer of each electrode and a through-hole forming step in an example of a method of manufacturing the acoustic wave device according to the fourth example embodiment of the present invention.

FIG. 16 is a schematic plan view for explaining a step of forming a first layer of each electrode in the example of the method of manufacturing the acoustic wave device according to the fourth example embodiment. FIGS. 17A and 17B are schematic cross-sectional views illustrating the portion corresponding to the cross-section taken along the line I-I in FIG. 1, for explaining a step of forming the first layer of each electrode and an interlayer insulating film forming step in the example of the method of manufacturing the acoustic wave device according to the fourth example embodiment. FIG. 18 is a schematic plan view for explaining a step of forming the second layer of each electrode in the example of the method of manufacturing the acoustic wave device according to the fourth example embodiment. FIGS. 19A and 19B are schematic cross-sectional views illustrating the portion corresponding to the cross-section taken along the line I-I in FIG. 1, for explaining a step of forming the second layer of each electrode and a through-hole forming step in the example of the method of manufacturing the acoustic wave device according to the fourth example embodiment.

The steps before forming each electrode can be performed in the same or similar manner as in the example of the method of manufacturing the acoustic wave device 10 according to the first example embodiment described above. That is, a laminate of the support and the piezoelectric layer 14 can be obtained in the same or similar manner as the method illustrated in FIGS. 4A to 4C, FIGS. 5A and 5B. Next, as illustrated in FIG. 16 and FIG. 17A, the first layer of each electrode is provided on the first main surface 14a of the piezoelectric layer 14. To be more specific, as illustrated in FIG. 16, the first layer 52a of the first wiring electrode and the first layer 53a of the second wiring electrode are provided on the first main surface 14a so as to overlap the outer peripheral edge of the sacrificial layer 21 in plan view.

The plurality of the first electrode fingers 28 are provided on the first main surface 14a of the piezoelectric layer 14 so as to be connected to the first layer 52a of the first wiring electrode. The plurality of the second electrode fingers 29 are provided on the first main surface 14a so as to be connected to the first layer 53a of the second wiring electrode.

The first layer 54a of the first extension electrode and the first layer 55a of the second extension electrode are provided on the first main surface 14a of the piezoelectric layer 14 so as to be connected to the first layer 52a of the first wiring electrode. To be more specific, the first layer 54a of the first extension electrode and the first layer 55a of the second extension electrode are provided so as to overlap the outer peripheral edge of the sacrificial layer 21 in plan view.

Further, the first layer 56a of the third extension electrode and the first layer 57a of the fourth extension electrode are provided on the first main surface 14a of the piezoelectric layer 14 so as to be connected to the first layer 53a of the second wiring electrode. To be more specific, the first layer 56a of the third extension electrode and the first layer 57a of the fourth extension electrode are provided so as to overlap the outer peripheral edge of the sacrificial layer 21 in plan view. The first layer 56a of the third extension electrode is formed so as not to be in contact with the first layer 54a of the first extension electrode. The first layer 57a of the fourth extension electrode is formed so as not to be in contact with the first layer 55a of the second extension electrode.

The first layer of each of the plurality of first electrode fingers 28, the plurality of second electrode fingers 29, the first wiring electrode, the second wiring electrode and the first to fourth extension electrodes can be provided by, for example, a sputtering method, a vacuum deposition method, or the like. In the example illustrated in FIG. 16, the respective first layers of the plurality of first electrode fingers 28, the plurality of second electrode fingers 29, the first wiring electrode, the second wiring electrode and the first to fourth extension electrodes are integrally formed at the same time. However, the first layers of the first wiring electrode, the first extension electrode and the second extension electrode may not be formed integrally. The first layers of the second wiring electrode, the third extension electrode and the fourth extension electrode may not be formed integrally.

Next, as illustrated in FIG. 17B, the first interlayer insulating film 58 is provided on the first main surface 14a of the piezoelectric layer 14 so as to cover a portion of the first layer 56a of the third extension electrode. To be more specific, the first interlayer insulating film 58 is provided so as to cover both a portion of the first layer 54a of the first extension electrode and a portion of the first layer 56a of the third extension electrode illustrated in FIG. 16. It is sufficient that the first interlayer insulating film 58 is provided so as to cover at least a portion of the third extension electrode.

Similarly, as illustrated in FIG. 17B, the second interlayer insulating film 59 is provided on the first main surface 14a of the piezoelectric layer 14 so as to cover a portion of the first layer 57a of the fourth extension electrode. To be more specific, the second interlayer insulating film 59 is provided so as to cover both a portion of the first layer 55a of the second extension electrode and a portion of the first layer 57a of the fourth extension electrode illustrated in FIG. 16. It is sufficient that the second interlayer insulating film 59 is provided so as to cover at least a portion of the fourth extension electrode.

Next, as illustrated in FIG. 18, the second layer 52b is provided on the first layer 52a of the first wiring electrode 52. The second layer 54b is provided on the first layer 54a of the first extension electrode 54, and on the first interlayer insulating film 58. To be more specific, as illustrated in FIG. 19A, the second layers 54b of the first extension electrode 54 is provided on the first interlayer insulating film 58 so as to overlap the first layer 56a of the third extension electrode 56 in plan view. Returning to FIG. 18, the second layer 55b is provided on the first layer 55a of the second extension electrode 55, and on the second interlayer insulating film 59. To be more specific, as illustrated in FIG. 19A, the second layers 55b of the second extension electrode 55 is provided on the second interlayer insulating film 59 so as to overlap the first layer 57a of the fourth extension electrode 57 in plan view.

As illustrated in FIG. 18, the second layer 53b is provided on the first layer 53a of the second wiring electrode 53. The second layer 56b is provided on the first layer 56a of the third extension electrode 56. The second layer 57b is provided on the first layer 57a of the fourth extension electrode 57.

The second layer of the first wiring electrode 52, the second wiring electrode 53 and the first to fourth extension electrodes can be provided by, for example, a sputtering method, a vacuum deposition method, or the like. In the example illustrated in FIG. 18, the respective second layers of the first wiring electrode 52, the first extension electrode 54 and the second extension electrode 55 are integrally formed at the same time. Similarly, the respective second layers of the second wiring electrode 53, the third extension electrode 56 and the fourth extension electrode 57 are integrally formed at the same time. However, the second layers of the first wiring electrode 52, the first extension electrode 54 and the second extension electrode 55 may not be formed integrally. The second layers of the second wiring electrode 53, the third extension electrode 56 and the fourth extension electrode 57 may not be formed integrally.

Next, as illustrated in FIG. 19B, a plurality of the through-holes 14e are provided in the piezoelectric layer 14 so as to extend to the sacrificial layer 21. To be more specific, the plurality of through-holes 14e are provided so as to be located inside the outer peripheral edge of the sacrificial layer 21 in plan view. Next, the sacrificial layer 21 is removed through the through-hole 14e. Thus, the cavity portion 10a illustrated in FIG. 14 is formed. As described above, the acoustic wave device according to the fourth example embodiment is obtained.

It is sufficient that which of the electrodes is to be used as the boundary covering electrode is determined in accordance with the number and positions of the through-holes 14e and a position of the boundary E between the membrane portion 14c and the supported portion 14d. For example, the boundary covering electrodes may include at least one electrode of the first wiring electrode 58 and the second wiring electrode 59, and at least one electrode of the first to fourth extension electrodes. It is sufficient to provide the boundary covering electrodes over the entire or substantially the entire portion, on the piezoelectric layer 14, that overlaps the boundary E, depending on the position of the boundary E.

A thickness-shear mode will be described in detail below. An "electrode" in an IDT electrode described below corresponds to the electrode finger in the present specification. A support in the following examples corresponds to the support substrate in the present specification. In the following description, a fact that a certain member is made of a certain material includes a case where a small amount of impurities that do not significantly deteriorate electrical characteristics of an acoustic wave device are contained.

Figure 20A:
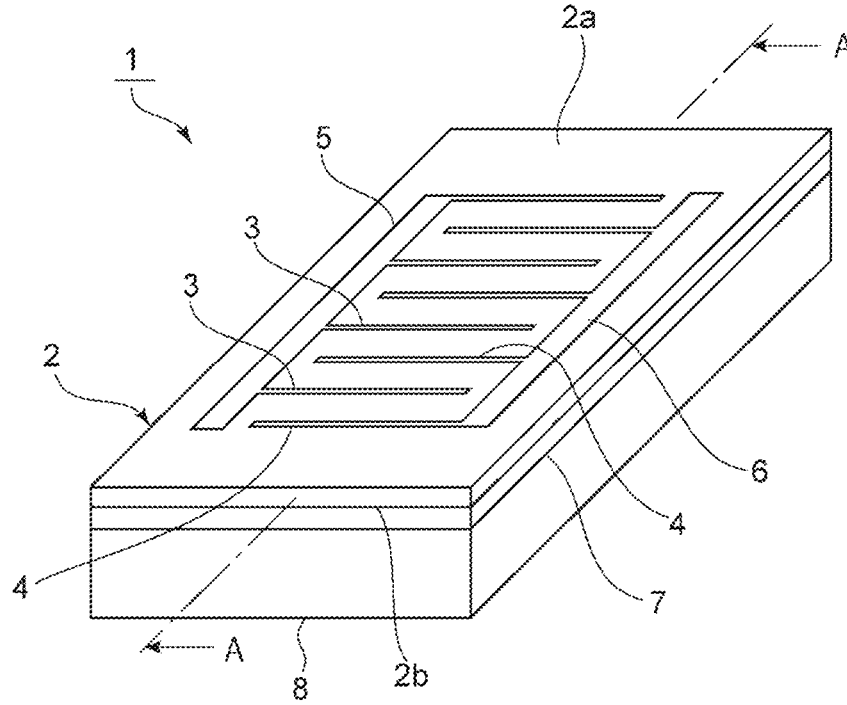
FIG. 20A is a schematic perspective view illustrating an appearance of an acoustic wave device in which a bulk wave in a thickness-shear mode is used.
Figure 20B:
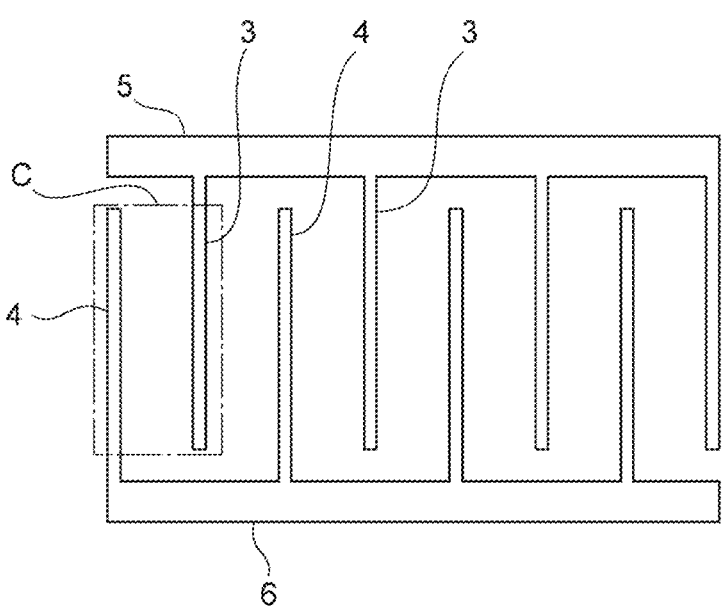
FIG. 20B is a plan view illustrating an electrode structure on a piezoelectric layer.
Figure 21:
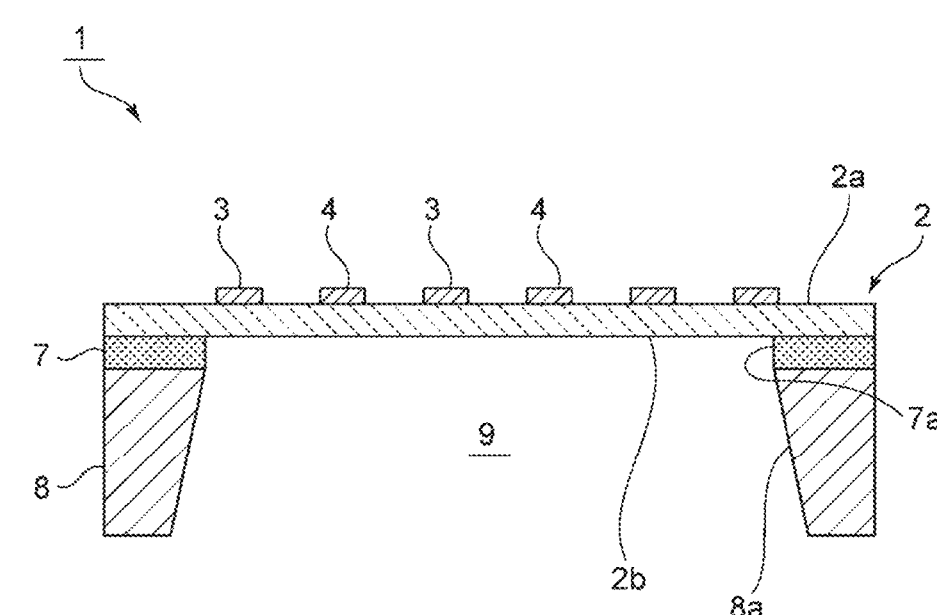
FIG. 21 is a cross-sectional view of a portion taken along a line A-A in FIG. 20A.

FIG. 20A is a schematic perspective view illustrating an appearance of an acoustic wave device in which a bulk wave in a thickness-shear mode is used, and FIG. 20B is a plan view illustrating an electrode structure on a piezoelectric layer, and FIG. 21 is a cross-sectional view of a portion taken along the line A-A in FIG. 20A.

An acoustic wave device 1 includes a piezoelectric layer 2 made of, for example, LiNbO₃. The piezoelectric layer 2 may be made of, for example, LiTaO₃. A cut angle of LiNbO₃ or LiTaO₃ is Z-cut, but may be rotated Y-cut or X-cut. A thickness of the piezoelectric layer 2 is not particularly limited, but is preferably, for example, equal to or greater than about 40 nm and equal to or less than about 1000 nm, and more preferably equal to or greater than about 50 nm and equal to or less than about 1000 nm in order to effectively excite the thickness-shear mode. The piezoelectric layer 2 includes a first main surface 2a and a second main surface 2b facing each other. Electrodes 3 and 4 are provided on the first main surface 2a. Here, the electrode 3 is an example of a "first electrode", and the electrode 4 is an example of a "second electrode". In FIGS. 20A and 20B, a plurality of the electrodes 3 are connected to a first busbar 5. A plurality of the electrodes 4 are connected to a second busbar 6. The plurality of electrodes 3 and the plurality of electrodes 4 are interdigitated with each other. The electrode 3 and the electrode 4 each have a rectangular or substantially rectangular shape and have a length direction. The electrode 3 and the electrode 4 face each other in a direction orthogonal or substantially orthogonal to the length direction. Both of the length direction of the electrodes 3 and 4 and the direction orthogonal or substantially orthogonal to the length direction of the electrodes 3 and 4 are directions intersecting a thickness direction of the piezoelectric layer 2. Thus, it can be said that the electrode 3 and the adjacent electrode 4 face each other in a direction intersecting the thickness direction of the piezoelectric layer 2. Further, the length direction of the electrodes 3 and 4 may be switched with the direction orthogonal or substantially orthogonal to the length direction of the electrodes 3 and 4 illustrated in FIGS. 20A and 20B. That is, in FIGS. 20A and 20B, the electrodes 3 and 4 may be extended in a direction in which the first busbar 5 and the second busbar 6 extend. In this case, the first busbar 5 and the second busbar 6 extend in the direction in which the electrodes 3 and 4 extend in FIGS. 20A and 20B. Then, a plurality of structures are provided in the above direction orthogonal or substantially orthogonal to the length direction of the electrodes 3 and 4, where each structure has one pair of the electrode 3 connected to one electric potential and the electrode 4 connected to another electric potential adjacent to each other. Here, the fact that the electrode 3 and the electrode 4 are adjacent to each other does not refer to a case where the electrode 3 and the electrode 4 are disposed so as to be in direct contact with each other, but a case where the electrode 3 and the electrode 4 are disposed with a gap interposed therebetween. Further, when the electrode 3 and the electrode 4 are adjacent to each other, electrodes connected to a hot electrode or a ground electrode, including the other electrodes 3 and 4, are not disposed between the electrode 3 and the electrode 4. The number of pairs is not necessarily an integer, and may be 1.5, 2.5, or the like. A center-to-center distance between the electrodes 3 and 4, that is, a pitch, is preferably, for example, in a range of equal to or greater than about 1 μm to equal to or less than about 10 μm. Further, widths of the electrodes 3 and 4, that is, dimensions of the electrodes 3 and 4 in a facing direction are preferably in a range of, for example, equal to or greater than about 50 nm to equal to or less than about 1000 nm, and more preferably in a range of equal to or greater than about 150 nm to equal to or less than about 1000 nm. The center-to-center distance between the electrodes 3 and 4 is a distance between a center of a dimension of the electrode 3 in the direction orthogonal or substantially orthogonal to the length direction of the electrode 3 (width dimension) and a center of a dimension of the electrode 4 in the direction orthogonal or substantially orthogonal to the length direction of the electrode 4 (width dimension).

In addition, in the acoustic wave device 1, since the Z-cut piezoelectric layer is used, the direction orthogonal or substantially orthogonal to the length direction of the electrodes 3 and 4 is a direction orthogonal or substantially orthogonal to a polarization direction of the piezoelectric layer 2. This is not the case when a piezoelectric material having a different cut angle is used for the piezoelectric layer 2. Here, the term "orthogonal" is not limited to a case of being strictly orthogonal, and may be substantially orthogonal (an angle formed by the direction orthogonal to the length direction of the electrodes 3 and 4 and the polarization direction is, for example, within a range of about 90°±10°).

A support 8 is laminated close to the second main surface 2b of the piezoelectric layer 2 with an insulating layer 7 interposed therebetween. The insulating layer 7 and the support 8 each have a frame shape, and include through-holes 7a and 8a as illustrated in FIG. 21. Thus, a cavity portion 9 is provided. The cavity portion 9 is provided so as not to hinder vibrations of the excitation region C of the piezoelectric layer 2. Thus, the above support 8 is laminated on the second main surface 2b with the insulating layer 7 interposed therebetween, at a position not overlapping a portion where at least one pair of the electrodes 3 and 4 are provided. The insulating layer 7 need not be provided. Thus, the support 8 may be directly or indirectly laminated on the second main surface 2b of the piezoelectric layer 2.

The insulating layer 7 is made of, for example, about silicon oxide. However, in addition to silicon oxide, an appropriate insulating material such as, for example, silicon oxynitride or alumina can be used. The support 8 is made of, for example, Si. Plane orientations of Si on a surface close to the piezoelectric layer 2 may be (100), (110), or (111). Si of the support 8 is preferably high in resistance with a resistivity of, for example, equal to or greater than about 4 kΩcm. However, the support 8 may be made using an appropriate insulating material or semiconductor material.

As the material of the support 8, for example, piezoelectric materials such as aluminum oxide, lithium tantalate, lithium niobate and crystal, various ceramics such as alumina, magnesia, sapphire, silicon nitride, aluminum nitride, silicon carbide, zirconia, cordierite, mullite, steatite and forsterite, or dielectric materials such as diamond and glass, or a semiconductor such as gallium nitride can be used.

The plurality of electrodes 3 and 4 and the first and second busbars 5 and 6 described above are made of appropriate metal or alloy such as, for example, Al or an AlCu alloy. In the acoustic wave device 1, the electrodes 3 and 4 and the first and second busbars 5 and 6 each include an Al film laminated on a Ti film. An adhesion layer other than the Ti film may be used.

In driving, an AC voltage is applied to a gap between the plurality of electrodes 3 and the plurality of electrodes 4. More specifically, an AC voltage is applied to a gap between the first busbar 5 and the second busbar 6. Thus, it is possible to obtain resonance characteristics by using a bulk wave in a thickness-shear mode excited in the piezoelectric layer 2. In addition, in the acoustic wave device 1, d/p is set, for example, to be equal to or less than about 0.5, where d is the thickness of the piezoelectric layer 2 and p is a center-to-center distance between the electrodes 3 and 4 that are arbitrary and adjacent to each other among the plurality of pairs of electrodes 3 and 4. Thus, the bulk wave in the thickness-shear mode described above is effectively excited, and favorable resonance characteristics can be obtained. More preferably, d/p is, for example, equal to or less than about 0.24, and in this case, even more favorable resonance characteristics can be obtained.

Since the acoustic wave device 1 has the above configuration, even when the number of pairs of the electrodes 3 and 4 is reduced in order to achieve miniaturization, a Q value is unlikely to be reduced. This is because a propagation loss is small even when the number of electrode fingers in reflectors on both sides is reduced. Further, the number of electrode fingers can be reduced because the bulk wave in the thickness-shear mode is used. Differences between a Lamb wave used in an acoustic wave device, and the bulk wave in the thickness-shear mode will be described with reference to FIGS. 22A and 22B.

Figure 22A:
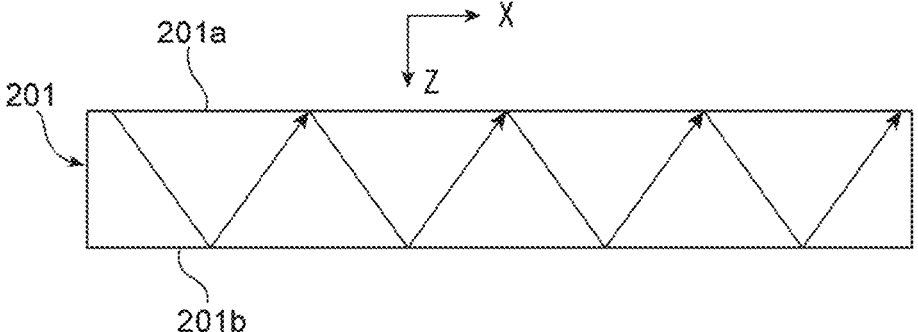
FIG. 22A is a schematic elevational cross-sectional view for explaining a Lamb wave propagating through a piezoelectric film of an acoustic wave device.

FIG. 22A is a schematic elevational cross-sectional view for explaining a Lamb wave propagating through a piezoelectric film of an acoustic wave device as described in Japanese Unexamined Patent Application Publication No. 2012-257019. Here, a wave propagates in a piezoelectric film 201 as indicated by arrows. Here, in the piezoelectric film 201, a first main surface 201a and a second main surface 201b face each other, and a thickness direction in which the first main surface 201a and the second main surface 201b are connected is a Z direction. An X direction is a direction in which electrode fingers in an IDT electrode are aligned. As illustrated in FIG. 22A, the Lamb wave propagates in the X direction. Although the piezoelectric film 201 vibrates as a whole since the wave is a plate wave, the wave propagates in the X direction, and thus reflectors are disposed on both sides to obtain resonance characteristics. Thus, a propagation loss of the wave occurs, and when miniaturization is intended, that is, when the number of pairs of electrode fingers is reduced, a Q value is reduced.

Figure 22B:
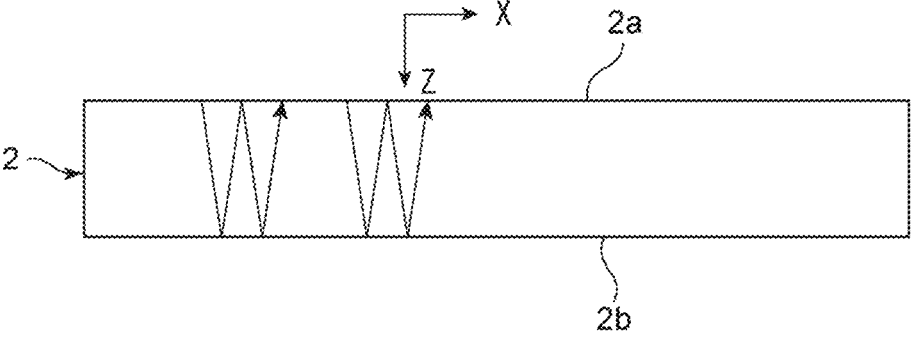
FIG. 22B is a schematic elevational cross-sectional view for explaining a bulk wave in a thickness-shear mode propagating through the piezoelectric film in the acoustic wave device.

On the other hand, as illustrated in FIG. 22B, in the acoustic wave device 1, vibration displacement occurs in a thickness-shear direction, and thus a wave propagates substantially in a direction in which the first main surface 2a and the second main surface 2b of the piezoelectric layer 2 are connected, that is, in the Z direction, and resonates. That is, an X direction component of the wave is significantly smaller than a Z direction component. Then, since the resonance characteristics are obtained by the propagation of the wave in the Z direction, the propagation loss is unlikely to be generated even when the number of electrode fingers of the reflector is reduced. Further, even when the number of electrode pairs including the electrodes 3 and 4 is reduced to promote miniaturization, the Q value is unlikely to be reduced.

Figure 23:
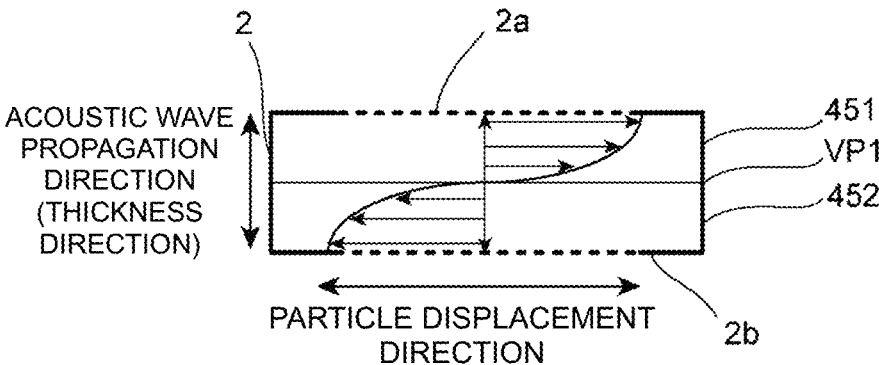
FIG. 23 is a diagram illustrating an amplitude direction of the bulk wave in the thickness-shear mode.

As illustrated in FIG. 23, an amplitude direction of the bulk wave in the thickness-shear mode is reversed between a first region 451 included in the excitation region C of the piezoelectric layer 2 and a second region 452 included in the excitation region C. FIG. 23 schematically illustrates a bulk wave when a voltage is applied to a gap between the electrode 3 and the electrode 4, the voltage in which the electrode 4 has a higher electric potential than that of the electrode 3. The first region 451 is a region in the excitation region C between the first main surface 2a, and a virtual plane VP1 that is orthogonal or substantially orthogonal to the thickness direction of the piezoelectric layer 2 and divides the piezoelectric layer 2 into two portions. The second region 452 is a region in the excitation region C between the virtual plane VP1 and the second main surface 2b.

As described above, in the acoustic wave device 1, at least one pair of electrodes including the electrode 3 and the electrode 4 is provided, but since a wave is not propagated in the X direction, the number of pairs of electrodes including the electrodes 3 and 4 need not be plural. That is, it is sufficient that at least one pair of electrodes are provided.

For example, the electrode 3 is an electrode connected to a hot potential, and the electrode 4 is an electrode connected to a ground potential. However, the electrode 3 may be connected to the ground potential, and the electrode 4 may be connected to the hot potential. In the acoustic wave device 1, at least one pair of electrodes are each an electrode connected to the hot potential or an electrode connected to the ground potential, and no floating electrode is provided, as described above.

Figure 24:
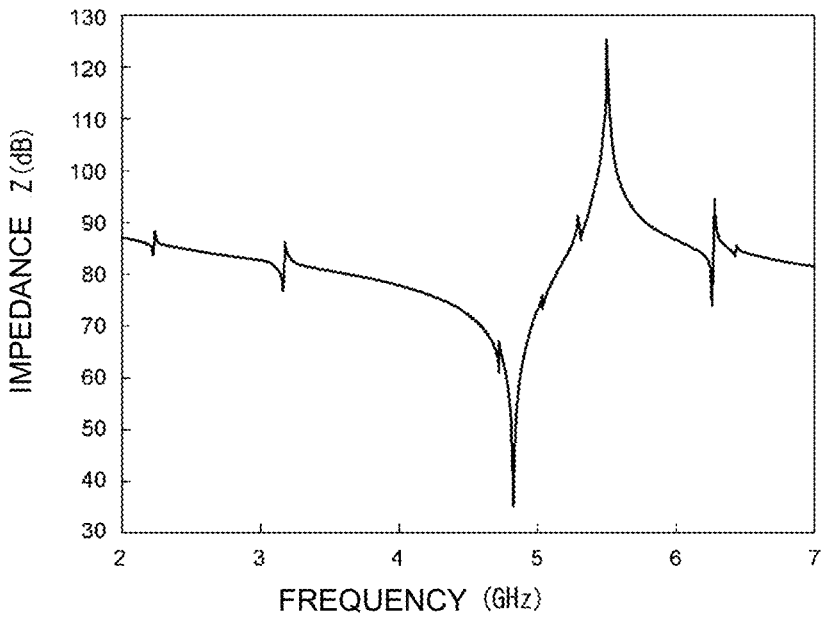
FIG. 24 is a graph showing resonance characteristics of the acoustic wave device in which the bulk wave in the thickness-shear mode is used.

FIG. 24 is a graph showing the resonance characteristics of the acoustic wave device illustrated in FIG. 21. Design parameters of the acoustic wave device 1 for obtaining the resonance characteristics are as follows.

Piezoelectric layer 2: LiNbO$_3$ of Euler angles (0°, 0°, 90°), a thickness=about 400 nm.

When viewed in the direction orthogonal or substantially orthogonal to the length direction of the electrodes 3 and 4, a length of a region where the electrodes 3 and 4 overlap, that is, the excitation region C, is about 40 μm, the number of pairs including the electrodes 3 and 4 is 21, the center-to-center distance between the electrodes is about 3 μm, the widths of the electrodes 3 and 4 are about 500 nm, and d/p is about 0.133.

Insulating layer 7: a silicon oxide film having a thickness of about 1 μm.

Support 8: Si.

Note that the length of the excitation region C is a dimension of the excitation region C along the length direction of the electrodes 3 and 4.

In the acoustic wave device 1, an inter-electrode distance of the electrode pair including the electrodes 3 and 4 was set to be equal or substantially equal for all of the plurality of pairs. That is, the electrodes 3 and the electrodes 4 were disposed at an equal or substantially equal pitch.

As is clear from FIG. 24, although a reflector is not provided, favorable resonance characteristics with a fractional bandwidth of about 12.5% are obtained.

Incidentally, as described above, in the acoustic wave device 1, d/p is, for example, equal to or less than about 0.5, and more preferably equal to or less than about 0.24, where d is the thickness of the piezoelectric layer 2 and p is the center-to-center distance between the electrode 3 and the electrode 4. This will be described with reference to FIG. 25.

Figure 25:
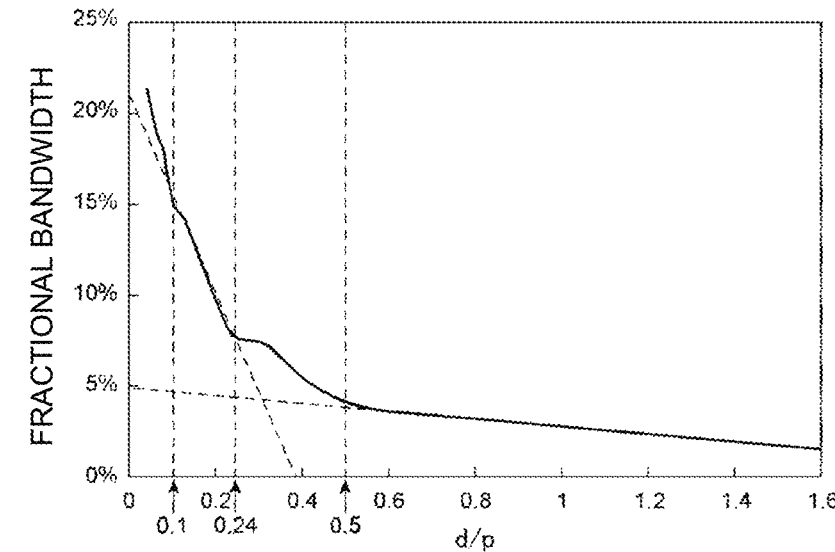
FIG. 25 is a graph showing a relationship between d/p and fractional bandwidth as a resonator, where p is a center-to-center distance between adjacent electrodes, and d is a thickness of a piezoelectric layer.

A plurality of acoustic wave devices were obtained in the same or similar manner as the acoustic wave device having the resonance characteristics shown in FIG. 24, except that d/p was changed. FIG. 25 is a graph showing a relationship between d/p and fractional bandwidth of the acoustic wave device as a resonator.

As is clear from FIG. 25, when d/p>about 0.5, the fractional bandwidth is less than about 5% even when d/p is adjusted. On the other hand, when d/p≤about 0.5, the fractional bandwidth can be increased to be equal to or greater than about 5% by changing d/p within the range, that is, a resonator having a high coupling coefficient can be configured. Further, when d/p is equal to or less than about 0.24, the fractional bandwidth can be increased to be equal to or greater than about 7%. In addition, when d/p is adjusted within this range, a resonator having a wider fractional bandwidth can be obtained, and a resonator having a higher coupling coefficient can be achieved. Thus, it is understood that a resonator having a high coupling coefficient in which the bulk wave in the thickness-shear mode described above is used can be configured by setting d/p to be equal to or less than about 0.5, for example.

Figure 26:
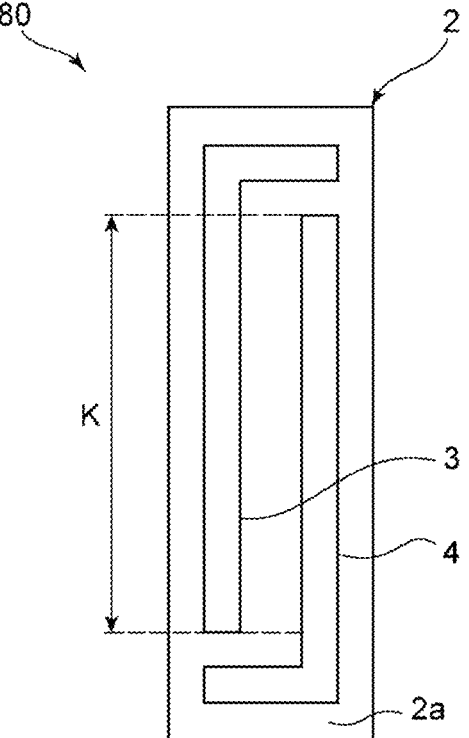
FIG. 26 is a plan view of an acoustic wave device in which a bulk wave in a thickness-shear mode is used.

FIG. 26 is a plan view of an acoustic wave device in which the bulk wave in the thickness-shear mode is used. In an acoustic wave device 80, one pair of electrodes including the electrode 3 and the electrode 4 are provided on the first main surface 2a of the piezoelectric layer 2. K in FIG. 26 is an intersection width. As described above, in acoustic wave devices according to example embodiments of the present invention, the number of pairs of electrodes may be one. In this case as well, as long as the above d/p is equal to or less than about 0.5, the bulk wave in the thickness-shear mode can be effectively excited.

Figure 27:
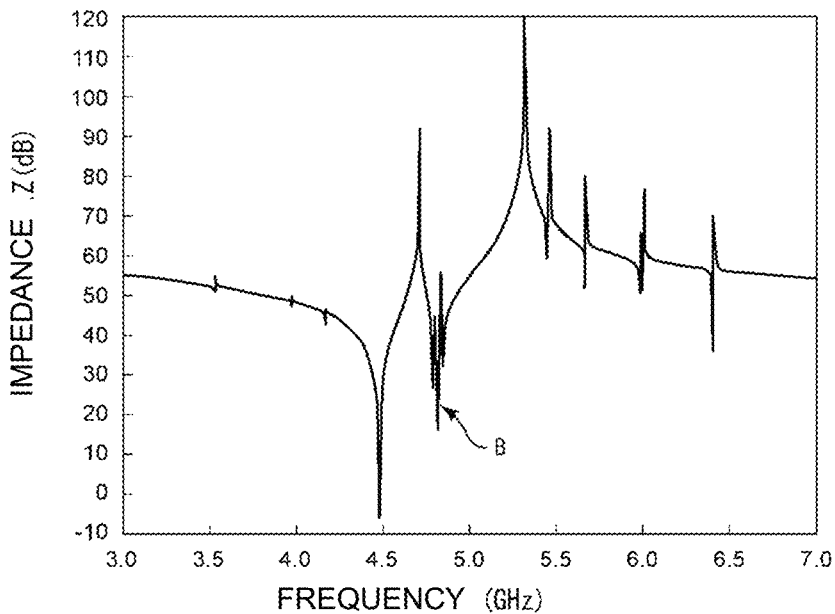
FIG. 27 is a graph showing resonance characteristics of the acoustic wave device of a reference example in which a spurious mode appears.

In the acoustic wave device 1, in the plurality of electrodes 3 and 4, with respect to the excitation region C, which is the region where the electrodes 3 and 4 that are arbitrary and adjacent to other overlap each other when viewed in a facing direction, a metallization ratio MR of the above adjacent electrodes 3 and 4 preferably satisfies MR≤about 1.75 (d/p)+0.075, for example. In this case, a spurious mode can be effectively reduced. This will be described with reference to FIG. 27 and FIG. 28. FIG. 27 is a reference diagram illustrating an example of the resonance characteristics of the acoustic wave device 1. A spurious mode indicated by an arrow B appears between a resonant frequency and an anti-resonant frequency. d/p was set to about 0.08 and Euler angles of LiNbO₃ were set to (0°, 0°, 90°). Further, the above metallization ratio MR was set to about 0.35.

The metallization ratio MR will be described with reference to FIG. 20B. In the electrode structure of FIG. 20B, when attention is paid to one pair of the electrodes 3 and 4, it is assumed that only the one pair of electrodes 3 and 4 are provided. In this case, a portion surrounded by a one dot chain line serves as the excitation region C. The excitation region C is, when the electrode 3 and the electrode 4 are viewed in the direction orthogonal or substantially orthogonal to the length direction of the electrodes 3 and 4, that is, in the facing direction, a region of the electrode 3 overlapping the electrode 4, a region of the electrode 4 overlapping the electrode 3, and a region where the electrode 3 and the electrode 4 overlap each other in a region between the electrode 3 and the electrode 4. Then, areas of the electrodes 3 and 4 in the excitation region C with respect to an area of the excitation region C leads to the metallization ratio MR. That is, the metallization ratio MR is a ratio of an area of a metallization portion to the area of the excitation region C.

When a plurality of pairs of electrodes is provided, it is sufficient that a ratio of metallization portions included in all excitation regions to a sum of areas of the excitation regions is defined as MR.

Figure 28:
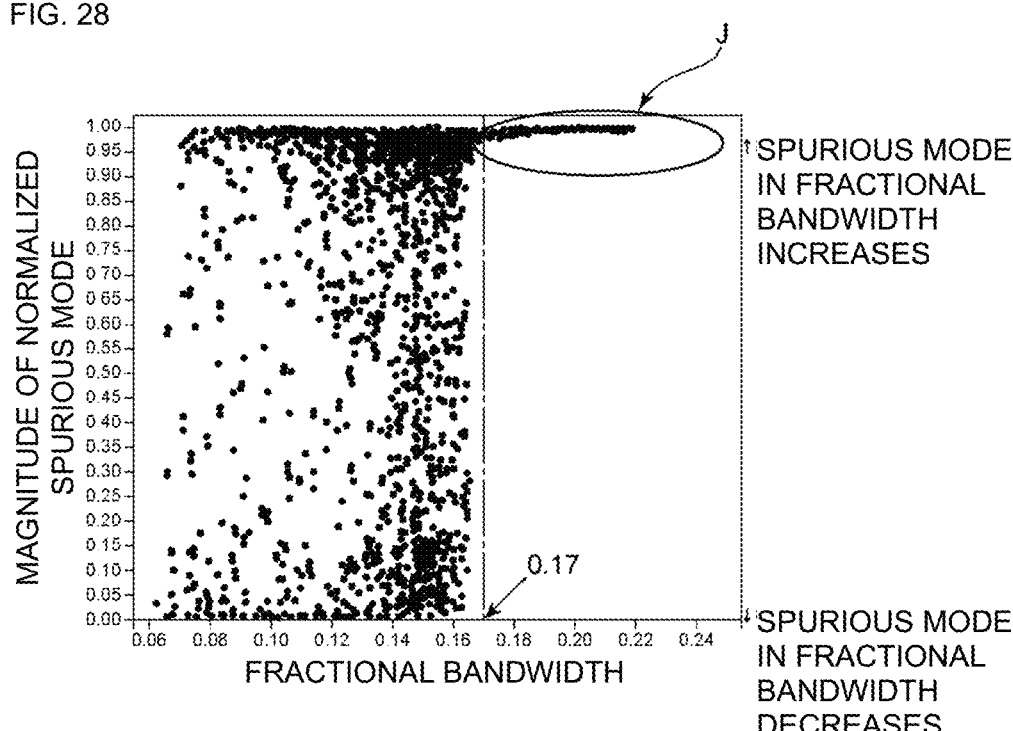
FIG. 28 is a graph showing a relationship between fractional bandwidth, and amount of phase rotation of impedance of spurious mode normalized by about 180 degrees as a magnitude of the spurious mode.

FIG. 28 is a graph, when a large number of acoustic wave resonators are configured according to the configuration of the acoustic wave device 1, showing a relationship between fractional bandwidth and amount of phase rotation of impedance of spurious mode normalized by about 180 degrees as a magnitude of the spurious mode. Note that the fractional bandwidth was adjusted by variously changing a piezoelectric layer in thickness and an electrode in dimension. Additionally, although FIG. 28 shows the results obtained by using a piezoelectric layer formed of Z-cut LiNbO₃, a tendency is the same or similar when a piezoelectric layer having another cut angle is used.

In a region surrounded by an ellipse J in FIG. 28, the spurious mode is as large as about 1.0. As is clear from FIG. 28, when the fractional bandwidth exceeds about 0.17, that is, when the fractional bandwidth exceeds about 17%, a large spurious mode having a spurious level of equal to or greater than about 1 appears in a pass band even when parameters for providing the fractional bandwidth are changed. That is, as in the resonance characteristics shown in FIG. 27, the large spurious mode indicated by the arrow B appears in the band. Thus, the fractional bandwidth is preferably equal to or less than about 17%, for example. In this case, the spurious mode can be reduced by adjusting the thickness of the piezoelectric layer 2 and the dimensions of the electrodes 3 and 4.

Figure 29:
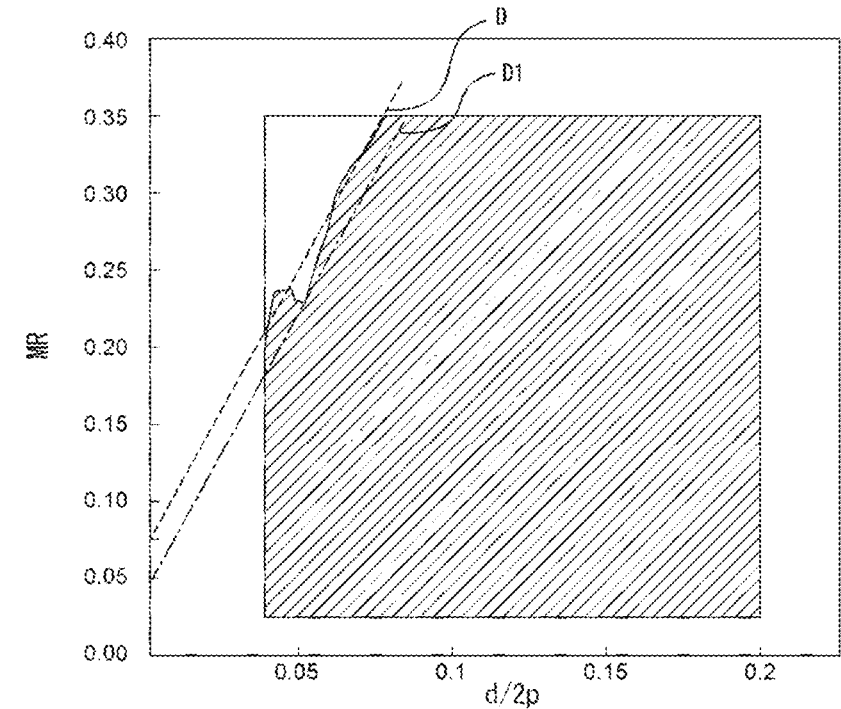
FIG. 29 is a graph showing a relationship between d/2p and metallization ratio MR.

FIG. 29 is a graph showing a relationship among d/2p, the metallization ratio MR and fractional bandwidth. In the above acoustic wave device, various acoustic wave devices different in d/2p and MR were provided, and the fractional bandwidth was measured. A hatched portion on a right side of a broken line D in FIG. 29 is a region where the fractional bandwidth is equal to or less than about 17%. A boundary between the hatched region and an unhatched region is represented by MR=about 3.5(d/2p)+0.075. That is, MR=about 1.75(d/p)+0.075. Thus, preferably, for example, MR≤about 1.75(d/p)+0.075. In this case, the fractional bandwidth is easily set to equal to or less than about 17%. A region on a right side of MR=about 3.5(d/2p)+0.05 indicated by a one dot chain line Dl in FIG. 29 is more preferable. That is, as long as MR≤about 1.75(d/p)+0.05, the fractional bandwidth can be reliably set to equal to or less than about 17%.

Figure 30:
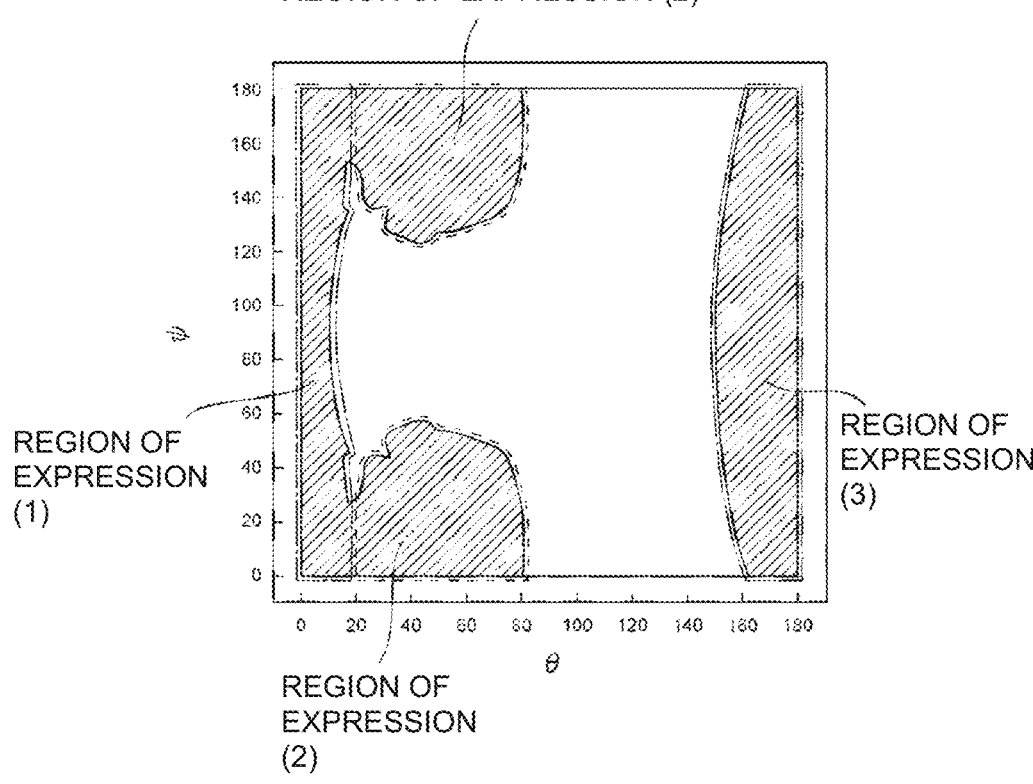
FIG. 30 is a graph showing a map of fractional bandwidth with respect to Euler angles $(0°, \theta, \psi)$ of $LiNbO_3$ when d/p is made to approach 0 as much as possible.

FIG. 30 is a graph showing a map of fractional bandwidth with respect to Euler angles (0°, θ, ψ) of LiNbO₃ when d/p is made to approach 0 as much as possible. Hatched portions in FIG. 30 are regions where the fractional bandwidth of at least equal to or greater than 5% is obtained, and ranges of the regions are approximated to ranges represented by the following Expression (1), Expression (2) and Expression (3).

$$(0°±10°,0° \text{ to } 20°,\text{arbitrary } ψ) \quad \text{Expression (1)}$$

$$(0°±10°,20° \text{ to } 80°,0° \text{ to } 60° \ (1−(θ−50)^2/900)^{1/2}) \text{ or}$$
$$(0°±10°,20° \text{ to } 80°,[180°−60°(1−(θ−50)^2/900)^{1/2}] \text{ to } 180°) \quad \text{Expression (2)}$$

$$(0°±10°,[180°−30° \ (1−(ψ−90)^2/8100)^{1/2}] \text{ to } 180°, \text{arbitrary } ψ) \quad \text{Expression (3)}$$

Thus, the fractional bandwidth can be sufficiently widened in the case of the range of the Euler angles in the above Expression (1), Expression (2) or Expression (3), which is preferable. The same applies to a case where the piezoelectric layer 2 is a lithium tantalate layer.

Figure 31:
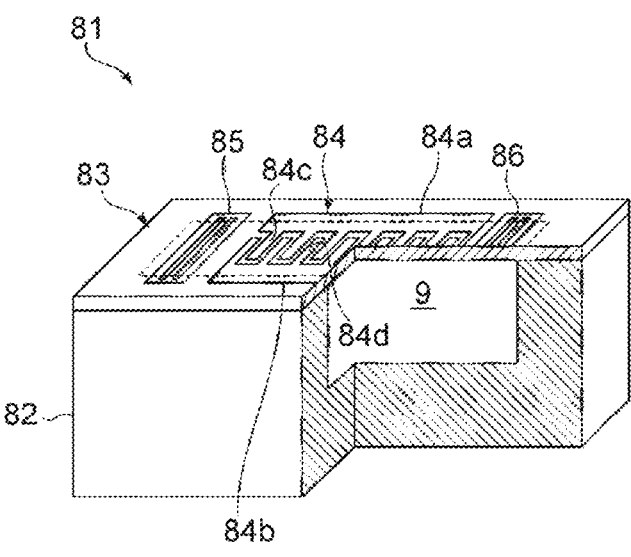
FIG. 31 is a partially cutaway perspective view for explaining an acoustic wave device in which a Lamb wave is used.

FIG. 31 is a partially cutaway perspective view for explaining an acoustic wave device in which a Lamb wave is used.

An acoustic wave device 81 includes a support substrate 82. The support substrate 82 includes a concave portion opened on an upper surface. A piezoelectric layer 83 is laminated on the support substrate 82. Thus, the cavity portion 9 is provided. An IDT electrode 84 is provided on the piezoelectric layer 83 above the cavity portion 9. Reflectors 85 and 86 are provided on both sides in an acoustic wave propagation direction of the IDT electrode 84. In FIG. 31, an outer peripheral edge of the cavity portion 9 is indicated by a broken line. Here, the IDT electrode 84 includes first and second busbars 84a and 84b, a plurality of first electrode fingers 84c, and a plurality of second electrode fingers 84d. The plurality of first electrode fingers 84c are connected to the first busbar 84a. The plurality of second electrode fingers 84d are connected to the second busbar 84b. The plurality of first electrode fingers 84c and the plurality of second electrode fingers 84d are interdigitated with each other.

In the acoustic wave device 81, by applying an alternating electric field to the IDT electrode 84 above the cavity portion 9, a Lamb wave as a plate wave is excited. Then, since the reflectors 85 and 86 are provided on both the sides, resonance characteristics by the above Lamb wave can be obtained.

As described above, acoustic wave devices according to example embodiments of the present invention may be one in which a plate wave is used. In this case, it is sufficient that the IDT electrode 84 and the reflectors 85 and 86 illustrated in FIG. 31 are provided on the piezoelectric layer in the acoustic wave device according to each of the above first to fourth example embodiments.

In the acoustic wave devices of the first to fourth example embodiments in which a bulk wave in a thickness-shear mode is used, as described above, d/p is preferably, for example, equal to or less than about 0.5, and more preferably equal to or less than about 0.24. This makes it possible to obtain further favorable resonance characteristics. Furthermore, in the acoustic wave devices of the first to fourth example embodiments in which the bulk wave in the thickness-shear mode is used, as described above, for example, MR≤about 1.75(d/p)+0.075 is preferably satisfied. In this case, a spurious mode can be reduced or prevented more reliably.

The functional electrode in the acoustic wave device of each of the first to fourth example embodiments in which the bulk wave in the thickness-shear mode is used may be a functional electrode including the one pair of electrodes illustrated in FIG. 26.

The piezoelectric layer in the acoustic wave device of each of the first to fourth example embodiments in which the bulk wave in the thickness-shear mode is used is preferably, for example, a lithium niobate layer or a lithium tantalate layer. Then, Euler angles ($\varphi$, $\theta$, $\psi$) of lithium niobate or lithium tantalate of the piezoelectric layer are preferably in the range of the above Expression (1), (2) or (3). In this case, the fractional bandwidth can be sufficiently widened.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
a support including a support substrate;
a piezoelectric layer on the support; and
a functional electrode on the piezoelectric layer and including at least one pair of electrodes; wherein
the support includes a cavity portion overlapping at least a portion of the functional electrode in plan view;
the piezoelectric layer includes a membrane portion overlapping the cavity portion in plan view, and a supported portion supported by the support; and
a boundary covering electrode is provided on the piezoelectric layer over an entire portion overlapping a boundary between the membrane portion and the supported portion in plan view.

2. The acoustic wave device according to claim 1, further comprising:
a first wiring electrode including a first busbar connected to a plurality of first electrode fingers; and
a second wiring electrode including a second busbar connected to a plurality of second electrode fingers; wherein
the at least one pair of electrodes includes the plurality of first electrode fingers and the plurality of second electrode fingers that are interdigitated with each other; and
the boundary covering electrode includes at least one of the first wiring electrode and the second wiring electrode.

3. The acoustic wave device according to claim 2, further comprising:
a first extension electrode connected to the first busbar and extending toward the second busbar; wherein the boundary covering electrode includes the first extension electrode.

4. The acoustic wave device according to claim 3, further comprising:
a second extension electrode connected to the first busbar, extending toward the second busbar, and sandwiching the plurality of first electrode fingers and the plurality of second electrode fingers together with the first extension electrode, when viewed from a direction in which the plurality of first electrode fingers and the plurality of second electrode fingers extend; wherein
the boundary covering electrode includes the second extension electrode.

5. The acoustic wave device according to claim 3, further comprising:
a third extension electrode connected to the second busbar and extending toward the first busbar; wherein
the boundary covering electrode includes the third extension electrode.

6. The acoustic wave device according to claim 5, further comprising:
a first interlayer insulating film; wherein
at least a portion of the first extension electrode and at least a portion of the third extension electrode overlap each other in plan view; and
at least a portion of the first interlayer insulating film is between the first extension electrode and the third extension electrode, in a portion where the first extension electrode and the third extension electrode overlap each other in plan view.

7. The acoustic wave device according to claim 5, further comprising:
a fourth extension electrode connected to the second busbar, extending toward the first busbar, and sandwiching the plurality of first electrode fingers and the plurality of second electrode fingers together with the third extension electrode, when viewed from a direction in which the plurality of first electrode fingers and the plurality of second electrode fingers extend; wherein
the boundary covering electrode includes the fourth extension electrode.

8. The acoustic wave device according to claim 7, further comprising:
a second extension electrode connected to the first busbar, extending toward the second busbar, and sandwiching the plurality of first electrode fingers and the plurality of second electrode fingers together with the first extension electrode, when viewed from the direction in which the plurality of first electrode fingers and the plurality of second electrode fingers extend; and
a second interlayer insulating film; wherein
the boundary covering electrode includes the second extension electrode;
at least a portion of the second extension electrode and at least a portion of the fourth extension electrode overlap each other in plan view; and
at least a portion of the second interlayer insulating film is between the second extension electrode and the fourth extension electrode, in a portion where the second extension electrode and the fourth extension electrode overlap each other in plan view.

9. The acoustic wave device according to claim 2, further comprising:
at least one floating electrode not connected to the first busbar and the second busbar; wherein the boundary covering electrode includes the floating electrode.

10. The acoustic wave device according to claim 9, further comprising:

one pair of the floating electrodes; wherein the one pair of floating electrodes sandwich the plurality of first electrode fingers and the plurality of second electrode fingers, when viewed from a direction in which the plurality of first electrode fingers and the plurality of second electrode fingers extend; and the boundary covering electrode includes the one pair of floating electrodes.

11. The acoustic wave device according to claim 2, wherein a through-hole is provided in the piezoelectric layer, and at least a portion of the through-hole is provided in the membrane portion of the piezoelectric layer; and the first wiring electrode covers a portion of the through-hole.

12. The acoustic wave device according to claim 1, wherein the piezoelectric layer includes a through-hole;

the through-hole includes a portion of the piezoelectric layer located at an outer peripheral edge of the membrane portion; and at the portion, the piezoelectric layer does not include a boundary between the membrane portion and the supported portion.

13. The acoustic wave device according to claim 1, wherein the support includes the support substrate, and an insulating layer on the support substrate; and the cavity portion is provided in the insulating layer.

14. The acoustic wave device according to claim 1, wherein the piezoelectric layer is a lithium niobate layer or a lithium tantalate layer.

15. The acoustic wave device according to claim 14, wherein the acoustic wave device is structured to generate a bulk wave in a thickness-shear mode.

16. The acoustic wave device according to claim 14, wherein d/p is equal to or less than about 0.5, where d is a thickness of the piezoelectric layer, and p is a center-to-center distance between the electrodes adjacent to each other.

17. The acoustic wave device according to claim 16, wherein d/p is equal to or less than about 0.24.

18. The acoustic wave device according to claim 16, wherein MR≤about 1.75 (d/p)+0.075 is satisfied, where a region at which adjacent electrodes overlap each other when viewed from a direction in which the adjacent electrodes face each other is an excitation region, and a metallization ratio of the at least one pair of electrodes to the excitation region is MR.

19. The acoustic wave device according to claim 15, wherein

Euler angles $(\varphi, \theta, \psi)$ of the lithium niobate layer or the lithium tantalate layer as the piezoelectric layer are in a range of Expression (1), Expression (2) or Expression (3):

$$(0°±10°, 0° \text{ to } 20°, \text{arbitrary } \psi) \qquad \text{Expression (1)};$$

$$(0°±10°, 20° \text{ to } 80°, 0° \text{ to } 60° (1-(\theta-50)^2/900)^{1/2}) \text{ or}$$
$$(0°±10°, 20° \text{ to } 80°, [180°-60° (1-(\theta-50)^2/900)^{1/2}] \text{ to } 180°) \qquad \text{Expression (2); and}$$

$$(0°±10°, [180°-30° (1-(\psi-90)^2/8100)^{1/2}] \text{ to } 180°, \text{arbitrary } \psi) \qquad \text{Expression (3)}.$$

20. The acoustic wave device according to claim 1, further comprising:

a first wiring electrode including a first busbar connected to a plurality of first electrode fingers; and a second wiring electrode including a second busbar connected to a plurality of second electrode fingers; wherein the at least one pair of electrodes include the plurality of first electrode fingers and the plurality of second electrode fingers that are interdigitated with each other; and the acoustic wave device is structured to generate a plate wave.

21. A method of manufacturing the acoustic wave device according to claim 1, the method comprising:

laminating the piezoelectric layer and the support;

providing the functional electrode and the boundary covering electrode on the piezoelectric layer; and forming the cavity portion in the support so as to open toward the piezoelectric layer to form the membrane portion and the supported portion of the piezoelectric layer; wherein in the forming the cavity portion, the cavity portion is formed such that the cavity portion overlaps at least a portion of the functional electrode in plan view, and the boundary covering electrode is located over an entire portion overlapping a boundary between the membrane portion and the supported portion in plan view.

22. The method of manufacturing the acoustic wave device according to claim 21, wherein the support includes a support substrate, and an insulating layer;

the piezoelectric layer includes a first main surface and a second main surface facing each other;

providing a sacrificial layer on the second main surface of the piezoelectric layer is further included;

in the laminating the piezoelectric layer and the support, the insulating layer is provided on the second main surface of the piezoelectric layer so as to cover the sacrificial layer, and then the support substrate is laminated on the insulating layer;

in the providing the boundary covering electrode, the boundary covering electrode is provided on the first main surface of the piezoelectric layer so as to overlap at least a portion of a boundary between a portion where the sacrificial layer is provided and a portion where the sacrificial layer is not provided in plan view; and in the forming the cavity portion, a through-hole extending to the sacrificial layer is provided in the piezoelectric layer, and the sacrificial layer is removed by using the through-hole.

23. The method of manufacturing the acoustic wave device according to claim 21, wherein the at least one pair of electrodes includes a plurality of first electrode fingers and a plurality of second electrode fingers that are interdigitated with each other;

in the providing the boundary covering electrode, a first wiring electrode including a first busbar connected to the plurality of first electrode fingers, a second wiring electrode including a second busbar connected to the plurality of second electrode fingers, and a first extension electrode connected to the first busbar and extending toward the second busbar are provided; and the boundary covering electrode includes at least one of the first wiring electrode and the second wiring electrode, and the first extension electrode.

24. The method of manufacturing the acoustic wave device according to claim 23, wherein in the providing the boundary covering electrode, a third extension electrode connected to the second busbar and extending toward the first busbar is provided, a first interlayer insulating film is provided so as to cover at least a portion of the third extension electrode, and at least a portion of the first extension electrode is provided on the first interlayer insulating film so as to overlap a portion of the third extension electrode in plan view; and the boundary covering electrode includes at least one of the first wiring electrode and the second wiring electrode, the first extension electrode and the third extension electrode.

* * * * *